(12) United States Patent
Hiramoto et al.

(10) Patent No.: US 9,071,722 B2
(45) Date of Patent: Jun. 30, 2015

(54) SOLID-STATE IMAGING ELEMENT, IMAGING DEVICE, AND SIGNAL PROCESSING METHOD

(71) Applicant: Panasonic Intellectual Property Corporation of America, Torrance, CA (US)

(72) Inventors: Masao Hiramoto, Osaka (JP); Tatsuya Nakamura, Osaka (JP); Toshiya Fujii, Shiga (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 37 days.

(21) Appl. No.: 13/985,453

(22) PCT Filed: Dec. 18, 2012

(86) PCT No.: PCT/JP2012/008080
§ 371 (c)(1),
(2) Date: Aug. 14, 2013

(87) PCT Pub. No.: WO2013/099151
PCT Pub. Date: Jul. 4, 2013

(65) Prior Publication Data
US 2014/0055649 A1 Feb. 27, 2014

(30) Foreign Application Priority Data

Dec. 26, 2011 (JP) ................................ 2011-283537

(51) Int. Cl.
*H04N 3/14* (2006.01)
*H04N 5/335* (2011.01)
(Continued)

(52) U.S. Cl.
CPC .......... *H04N 9/045* (2013.01); *H01L 27/14621* (2013.01); *H01L 27/14629* (2013.01); *H01L 27/14625* (2013.01); *H01L 27/14627* (2013.01)

(58) Field of Classification Search
USPC .......... 348/294–324; 250/208.1; 257/290–292
See application file for complete search history.

(56) References Cited

U.S. PATENT DOCUMENTS

2002/0005471 A1   1/2002   Suzuki
2003/0063204 A1   4/2003   Suda
(Continued)

FOREIGN PATENT DOCUMENTS

JP    59-090467 A    5/1984
JP    2000-151933 A    5/2000
(Continued)

OTHER PUBLICATIONS

International Search Report for corresponding International Application No. PCT/JP2012/008080 mailed Mar. 12, 2013.

*Primary Examiner* — Yogesh Aggarwal
(74) *Attorney, Agent, or Firm* — Renner, Otto, Boisselle & Sklar, LLP

(57) ABSTRACT

This solid-state image sensor includes a photosensitive cell array including first through fourth photosensitive cells $2a$ to $2d$ and a light dispersing element array that is arranged to face the photosensitive cell array and that includes first and second types of light dispersing elements $1a$, $1b$. If light that would be directly incident on each photosensitive cell, were it not for the light dispersing element array, is called that photosensitive cell's entering light, the light dispersing element array is configured so that the first type of light dispersing element $1a$ makes a part of light rays with the first color component, which is included in the entering light of each of the first and second photosensitive cells $2a$, $2b$, incident on the first photosensitive cell $2a$ and that the second type of light dispersing element $1b$ makes a part of light rays with the second color component, which is included in the entering light of each of the third and fourth photosensitive cells $2c$, $2d$, incident on the fourth photosensitive cell $2d$.

13 Claims, 12 Drawing Sheets

(51) Int. Cl.
*H04N 9/04* (2006.01)
*H01L 27/146* (2006.01)

(56) References Cited

U.S. PATENT DOCUMENTS

| | | |
|---|---|---|
| 2010/0188537 A1 | 7/2010 | Hiramoto et al. |
| 2011/0007179 A1 | 1/2011 | Hiramoto et al. |
| 2011/0050941 A1 | 3/2011 | Hiramoto et al. |
| 2011/0102635 A1 | 5/2011 | Fukunaga et al. |
| 2011/0164156 A1* | 7/2011 | Hiramoto et al. ............. 348/272 |

FOREIGN PATENT DOCUMENTS

| | | |
|---|---|---|
| JP | 2001-309395 A | 11/2001 |
| JP | 2003-078917 A | 3/2003 |
| WO | WO 2009/153937 A1 | 12/2009 |
| WO | WO 2010/001811 A1 | 1/2010 |
| WO | WO 2010/058545 A1 | 5/2010 |
| WO | WO 2010/082455 A1 | 7/2010 |
| WO | WO 2011/010455 A1 | 1/2011 |

\* cited by examiner

SOLID-STATE IMAGING ELEMENT, IMAGING DEVICE, AND SIGNAL PROCESSING METHOD

TECHNICAL FIELD

The present application relates to a technique for increasing the sensitivity of a solid-state image sensor and realizing color representation.

BACKGROUND ART

Recently, the performance and functionality of digital cameras and digital movie cameras that use some solid-state image sensor such as a CCD and a CMOS (which will be simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. And the performance of image sensors has been further enhanced as well. Meanwhile, cameras that use a backside illumination type image sensor, which receives incoming light on its back surface side, not on its principal surface side with a wiring layer for the solid-state image sensor, have been developed just recently and their property has attracted a lot of attention these days. Nevertheless, the greater the number of pixels in an image sensor, the lower the intensity of the light falling on a single pixel and the lower the sensitivity of camera tends to be.

The sensitivity of cameras has dropped recently due to not only such a significant increase in resolution but also the use of a color-separating color filter itself. In an ordinary color camera, a subtractive color filter that uses an organic pigment as a dye is arranged to face each photosensitive cell of an image sensor. A color filter transmits one color component of incoming light to use but absorbs the other components of the light. That is why with such a color filter, the optical efficiency of a camera would decrease. Specifically, in a color camera that uses a Bayer color filter arrangement in which color filters in three colors are arranged using a combination of one red (R) pixel, two green (G) pixels and one blue (B) pixel as a fundamental unit, the R color filter transmits an R ray but absorbs G and B rays, the G color filter transmits a G ray but absorbs R and B rays, and the B color filter transmits a B ray but absorbs R and G rays. Consequently, the sum of the quantities of light that can be used by a color camera with the Bayer arrangement is approximately only one-third of the entire incoming light.

To overcome such a decreased sensitivity problem, Patent Document No. 1 discloses a technique for increasing the quantity of the light received by attaching an array of micro lenses to a photodetector section of an image sensor so that a greater percentage of the incoming light can be used. According to this technique, the incoming light is condensed onto photosensitive cells with those micro lenses, thereby substantially increasing the optical aperture ratio of the image sensor. And this technique is now used in almost all solid-state image sensors. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a technique for taking in as much incoming light as possible by using multilayer color filters (as dichroic mirrors) and micro lenses in combination. Such a technique uses a combination of dichroic mirrors, each of which does not absorb light but selectively transmits only a component of light falling within a particular wavelength range and reflects the rest of the light falling within the other wavelength ranges. As a result, only a required component of the incoming light falling within a particular wavelength range can be incident on each photosensing section with causing a significant loss of the incoming light.

FIG. 10 schematically illustrates a cross section of the image sensor of Patent Document No. 2 as viewed on a plane that intersects with its imaging area at right angles. This image sensor includes two condensing micro lenses 4a and 4b, which are respectively arranged on the surface and inside of the image sensor, an opaque member 20, photosensitive cells 2a, 2b, and 2c, and dichroic mirrors 17, 18 and 19, which are arranged so as to face photosensitive cells 2a, 2b and 2c, respectively. The dichroic mirror 17 has such a property as to transmit an R ray and reflect G and B rays. The dichroic mirror 18 has such a property as to reflect a G ray and transmit R and B rays. And the dichroic mirror 19 has such a property as to reflect a B ray and transmit R and G rays. The light that has impinged on the micro lens 4a has its luminous flux adjusted by the micro lens 4b, and then enters the first dichroic mirror 17, which transmits an R ray but reflects G and B rays. The light ray that has been transmitted through the first dichroic mirror 17 is then incident on the photosensitive cell 2a. On the other hand, the G and B rays that have been reflected from the first dichroic mirror 17 enter the second dichroic mirror 18 adjacent to the first dichroic mirror 17. The second dichroic mirror 18 reflects the G ray of the incoming light and transmits its B ray. The G ray that has been reflected from the second dichroic mirror 18 is incident on the photosensitive cell 2b. On the other hand, the B ray that has been transmitted through the second dichroic mirror 18 is reflected from the third dichroic mirror 19 and then incident on the photosensitive cell 2c that is located right under the dichroic mirror 19. In this manner, in the image sensor disclosed in Patent Document No. 2, the visible light that has impinged on the condensing micro lens 4a is not absorbed into color filters but their RGB components can be detected by the three photosensitive cells non-wastefully.

Meanwhile, Patent Document No. 3 discloses an image sensor that can minimize the loss of light by using a micro prism. Such an image sensor has a structure in which the incoming light is dispersed by the micro prism into red, green and blue rays to be received by three different photosensitive cells. Even when such an image sensor is used, the optical loss can also be minimized.

According to the techniques disclosed in Patent Documents Nos. 2 and 3, however, the number of photosensitive cells to provide needs to be as many as that of the dichroic mirrors to use or that of the color components to produce by splitting the incoming light. That is why to detect light rays in the three primary colors of RGB, for example, the number of photosensitive cells to provide should be tripled compared to a situation where traditional color filters are used, which is a problem.

Thus, to overcome such problems with the related art, Patent Document No. 4 discloses a technique for increasing the optical efficiency by using dichroic mirrors and reflected light, although some loss of the incoming light is involved. FIG. 11 is a partial cross-sectional view of an image sensor that adopts such a technique. As shown in FIG. 11, dichroic mirrors 22 and 23 are embedded in a light-transmitting resin 21. Specifically, the dichroic mirror 22 has such a property as to transmit a G ray and reflect R and B rays, while the dichroic mirror 23 has such a property as to transmit an R ray and reflect G and B rays.

Such a structure cannot receive a B ray at its photosensing section but can sense R and G rays entirely under the following principle. First, if an R ray impinges on the dichroic mirrors 22 and 23, the R ray is reflected from the dichroic mirror 22 but transmitted through the dichroic mirror 23. The R ray that has been reflected from the dichroic mirror 22 is also reflected from the interface between the light-transmitting resin 21 and the air, and then strikes the dichroic mirror 23. Then, the R ray is transmitted through the dichroic mirror 23 and then also transmitted through an organic dye filter 25 and a micro lens 26 that transmit the R ray. In this manner, even though only a part of the light is reflected from a metal layer 27, almost all of the R ray that has impinged on the dichroic mirrors 22 and 23 is incident on the photosensing section. On the other hand, if a G ray impinges on the dichroic mirrors 22 and 23, the G ray is transmitted through the dichroic mirror 22 but reflected from the dichroic mirror 23. The G ray that has been reflected from the dichroic mirror 23 is also totally reflected from the interface between the light-transmitting resin 21 and the air, and then strikes the dichroic mirror 22. Then, the G ray is transmitted through the dichroic mirror 22 and then also transmitted through an organic dye filter 24 and a micro lens 26 that transmit the G ray. In this manner, even though only a part of the light is reflected from the metal layer 27, almost all of the G ray that has impinged on the dichroic mirrors 22 and 23 is incident on the photosensing section almost without causing loss.

According to the technique disclosed in Patent Document No. 4, only one of the three color rays of RGB is lost but light rays of the other two colors can be received with almost no loss based on the principle described above. That is why there is no need to provide photosensing sections for all of the three colors of RGB. In this case, comparing such an image sensor to the one that does not use any dichroic mirrors but uses only organic dye filters to realize a color representation, it can be seen that the image capturing sensitivity can be doubled by this technique. This is because the optical efficiency achieved by using only organic dye filters is approximately one-third but the optical efficiency achieved by adopting the technique disclosed in Patent Document No. 4 is approximately two-thirds of the entire incoming light. Nevertheless, even if such a technique is adopted, one out of the three colors should be sacrificed.

Furthermore, Patent Document No. 5 discloses a color representation technique for improving, by providing light dispersing elements for photosensitive cells, the optical efficiency without significantly increasing the number of photosensitive cells to use. According to such a technique, each of the light dispersing elements provided for the photosensitive cells splits the incoming light into multiple light rays and makes those light rays incident on the photosensitive cells according to their wavelength ranges. In this case, each of the photosensitive cells receives combined light rays, in which multiple components falling within mutually different wavelength ranges have been superposed one upon the other, from multiple light dispersing elements. As a result, a color signal can be generated by performing a signal arithmetic operation on the photoelectrically converted signals supplied from the respective photosensitive cells. Even though this color representation technique is suitable to an image sensor with a cell pitch of approximately 1 μm, the color representation performance achieved tends to decline as the cell pitch increases.

CITATION LIST

Patent Literature

Patent Document No. 1: Japanese Laid-Open Patent Publication No. 59-90467
Patent Document No. 2: Japanese Laid-Open Patent Publication No. 2000-151933
Patent Document No. 3: Japanese Laid-Open Patent Publication No. 2001-309395
Patent Document No. 4: Japanese Laid-Open Patent Publication No. 2003-78917
Patent Document No. 5: PCT International Application Publication No. 2009/153937

SUMMARY OF INVENTION

Technical Problem

To sum up, according to the conventional technologies, if light-absorbing color filters are used, the number of photosensitive cells to provide does not have to be increased significantly but the optical efficiency achieved will be low. Nevertheless, if dichroic mirrors or micro prisms are used as in the techniques disclosed in Patent Document Nos. 2 to 4, then the optical efficiency will be high but the number of photosensitive cells to provide should be increased considerably.

Meanwhile, according to the technique disclosed in Patent Document No. 5, a color image can be certainly obtained with the optical efficiency improved, theoretically speaking. However, an image sensor with a long cell pitch (e.g., as long as 4 to 5 μm) would have significantly deteriorated color representation performance. For that reason, it is difficult for an image capture device that attempts to improve the sensitivity by increasing the cell pitch to realize excellent performance.

An embodiment of the present invention provides a color image capturing technique that contributes to not only improving the optical efficiency without increasing the number of photosensitive cells to provide significantly but also achieving good color reproducibility even when a high-sensitivity image sensor with as long a cell pitch as well over 1 μm is used.

Solution to Problem

To overcome these problems, a solid-state image sensor according to an aspect of the present invention includes: a photosensitive cell array in which a plurality of unit blocks, each including first, second, third and fourth photosensitive cells, are arranged two-dimensionally; and a light dispersing element array that is arranged so as to face the photosensitive cell array and that includes first and second types of light dispersing elements. If light that would be directly incident on each photosensitive cell, were it not for the light dispersing element array, is called that photosensitive cell's entering light and if visible light rays included in the cell's entering light is comprised of first, second and third color components and if a rest of the visible light rays, which is made up of color components other than a particular one of the first, second and third color components, is called a complementary color ray of that particular color component, the light dispersing element array is configured so that the first type of light dispersing element makes a part of light rays with the first color component, which is included in the entering light of each of the first and second photosensitive cells, incident on the first photosensitive cell and that the second type of light dispersing element makes a part of light rays with the second color component, which is included in the entering light of each of the third and fourth photosensitive cells, incident on the fourth photosensitive cell.

This general and particular aspect can be implemented as a system, a method, a computer program or a combination thereof.

Advantageous Effects of Invention

According to an aspect of the present invention, a light dispersing element that makes an incoming light ray incident on any of multiple different photosensitive cells is used according to its color component. As a result, even a high-sensitivity image sensor with a cell pitch of far more than 1 μm can also capture a color image with high optical efficiency and high color reproducibility without significantly increasing the number of photosensitive cells to use.

DESCRIPTION OF EMBODIMENTS

Figure 1:
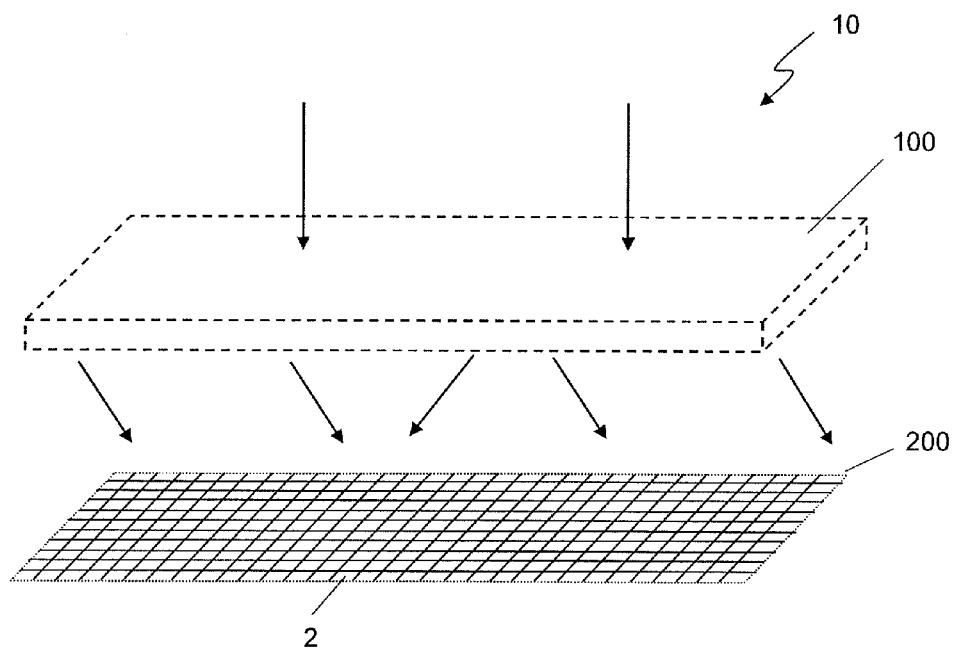
FIG. 1A perspective view schematically illustrating a relative arrangement of photosensitive cells 200 and light dispersing elements 100 in a solid-state image sensor according to the present invention.

To overcome the problems described above, a solid-state image sensor according to an aspect of the present invention includes: photosensitive cell array in which a plurality of unit blocks, each including first, second, third and fourth photosensitive cells, are arranged two-dimensionally; and a light dispersing element array which is arranged so as to face the photosensitive cell array and which includes first and second types of light dispersing elements. If light that would be directly incident on each photosensitive cell, were it not for the light dispersing element array, is called that photosensitive cell's entering light and if visible light included in the cell's entering light is comprised of first, second and third color components and if the rest of the visible light, which is made up of color components other than a particular one of the color components, is called a complementary color ray of that particular color component, the light dispersing element array is configured so that the first type of light dispersing element makes a part of light rays with the first color component, which is included in the entering light of each of the first and second photosensitive cells, incident on the first photosensitive cell and that the second type of light dispersing element makes a part of light rays with the second color component, which is included in the entering light of each of the third and fourth photosensitive cells, incident on the fourth photosensitive cell.

In one embodiment, each of the first through fourth photosensitive cells has a square shape, the first through fourth photosensitive cells are arranged in two rows and two columns, the first type of light dispersing element is arranged to face a boundary between the first and second photosensitive cells, and the second type of light dispersing element is arranged to face a boundary between the third and fourth photosensitive cells.

In one embodiment, the first type of light dispersing element is arranged to face a boundary between the first and third photosensitive cells, too, and the second type of light dispersing element is arranged to face a boundary between the second and fourth photosensitive cells, too.

In one embodiment, the first type of light dispersing element further makes a part of light rays with the first color component, which is included in the entering light of each of the first and third photosensitive cells, incident on the first photosensitive cell and the second type of light dispersing element further makes a part of light rays with the second color component, which is included in the entering light of each of the second and fourth photosensitive cells, incident on the fourth photosensitive cell.

In one embodiment, the first type of light dispersing element makes a part of the light ray with the first color component, which is included in the entering light of each of the first and second photosensitive cells, incident on the first photosensitive cell, and also makes the rest of the light ray with the first color component and a complementary color ray of the first color component incident on the second photosensitive cell. The second type of light dispersing element makes a part of the light ray with the second color component, which is included in the entering light of each of the third and fourth photosensitive cells, incident on the fourth photosensitive cell, and also makes the rest of the light ray with the second color component and a complementary color ray of the second color component incident on the third photosensitive cell.

In one embodiment, the first type of light dispersing element further makes a part of the light ray with the first color component, which is included in the entering light of each of the first and third photosensitive cells, incident on the first photosensitive cell, and also makes the rest of the light ray with the first color component and a complementary color ray of the first color component incident on the third photosensitive cell. The second type of light dispersing element makes a part of the light ray with the second color component, which is included in the entering light of each of the second and fourth photosensitive cells, incident on the fourth photosensitive cell, and also makes the rest of the light ray with the second color component and a complementary color ray of the second color component incident on the second photosensitive cell.

In one embodiment, the first type of light dispersing element includes four light dispersing elements which are arranged to face four boundaries that surround the first photosensitive cell and the second type of light dispersing element includes four light dispersing elements which are arranged to face four boundaries that surround the fourth photosensitive cell.

In one embodiment, the first color component is one of colors red and blue components and the second color component is the other of the colors red and blue components.

In one embodiment, each of the first and second types of light dispersing elements has a light-transmitting member, and splits the incoming light by using the shape of the light-transmitting member and a difference in refractive index between that light-transmitting member and another light-transmitting member that has a lower refractive index than the former light-transmitting member.

An image capture device according to an aspect of the present invention includes: a solid-state image sensor according to any of the embodiments described above; an optical system which produces an image on the solid-state image sensor; and a signal processing section which processes signals supplied from the solid-state image sensor and which generates color information by performing arithmetic operations on first, second, third and fourth photoelectrically converted signals that have been supplied from the first, second, third and fourth photosensitive cells, respectively.

In one embodiment, the signal processing section generates first and second color difference signals by calculating the difference between the first photoelectrically converted signal and the average of the first through fourth photoelectrically converted signals and the difference between the fourth photoelectrically converted signal and the first through fourth photoelectrically converted signals.

A signal processing method according to an aspect of the present invention is a method for processing output signals of a solid-state image sensor according to any of the embodiments described above. The method includes the steps of: (A) getting first, second, third and fourth photoelectrically converted signals from the first, second, third and fourth photosensitive cells, respectively; and (B) generating color information based on the first through fourth photoelectrically converted signals.

In one embodiment, the step (B) includes the steps of: generating a first differential signal by calculating the difference between the first and second photoelectrically converted signals; and generating a second differential signal by calculating the difference between the third and fourth photoelectrically converted signals.

In one embodiment, the step (B) includes the steps of: generating a luminance signal by performing an arithmetic operation that involves adding together the first and second photoelectrically converted signals, or the third and fourth photoelectrically converted signals, or the first through fourth photoelectrically converted signals; and generating colors red, green and blue signals included in the cell's entering light based on the luminance signal and the first and second differential signals.

First of all, an embodiment of the present disclosure will be outlined with reference to FIGS. 1, 2A through 2F, and 3A through 3F before its specific embodiments are described. In the following description, to spatially split incident light into multiple components of light falling within mutually different wavelength ranges or having respectively different color components will be referred to herein as "splitting of light".

A solid-state image sensor according to an aspect of the present invention includes a photosensitive cell array in which photosensitive cells (pixels) are arranged two-dimensionally on an imaging area and a light dispersing element array including a number of light dispersing elements. FIG. 1 is a perspective view illustrating schematically respective portions of a photosensitive cell array 200 and a light dispersing element array 100, which are stacked in this order on the imaging area of a solid-state image sensor 10. The light dispersing element array 100 is arranged so as to face the photosensitive cell array 200 and to receive the incoming light. It should be noted that the photosensitive cells 2 do not have to have such an arrangement, shape or size as the one shown in FIG. 1 but may also have any other known arrangement, shape or size. Also, the light dispersing element array 100 is illustrated in FIG. 1 as a quadrangular prism for convenience sake but actually does not always have such a shape but may have any of various other structures as well. Each of those light dispersing elements may be a micro lens or any other transparent member with a high refractive index, and is arranged to split incoming light into light rays to travel in multiple different directions according to its wavelength.

On receiving incoming light, each photosensitive cell 2 performs photoelectric conversion on the light and outputs an electrical signal representing the intensity (or the quantity) of the light received. Such an electrical signal will be referred to herein as a "photoelectrically converted signal" or a "pixel signal". In this embodiment, each photosensitive cell 2 receives multiple light rays that fall within multiple different wavelength ranges (i.e., light rays with multiple different color components) and that have had their traveling direction changed by the light dispersing element array 100. As a result, the light actually received by each photosensitive cell 2 has multiple distributions of split light rays (i.e., multiple intensity distributions associated with respective wavelength ranges), which are different from those of the light that would be received were it not for the light dispersing elements. Also, the light dispersing element array 100 does not split the incoming light entirely but splits it at a certain ratio k (where k is a real number that is greater than zero and equal to or smaller than one).

Hereinafter, the basic structure of this image sensor 10 will be described with reference to FIGS. 2A through 2E.

Figure 2A:
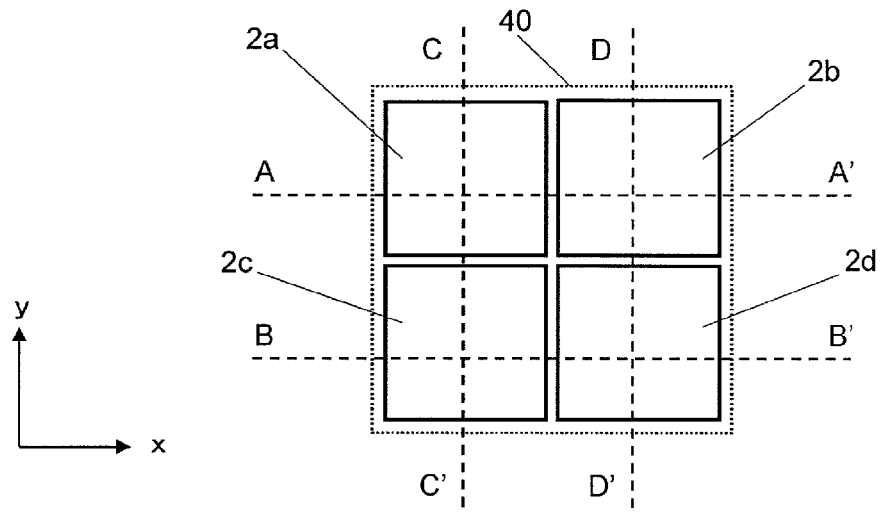
FIG. 2A A plan view illustrating an exemplary unit block of a solid-state image sensor according to an embodiment of the present invention.

FIG. 2A is a plan view illustrating an exemplary basic pixel structure (which will be referred to herein as a "unit block") 40 of the photosensitive cell array 200. The photosensitive cell array 200 has a structure in which a plurality of unit blocks 40, each including four photosensitive cells 2a, 2b, 2c and 2d, are arranged two-dimensionally on an imaging area. In the example illustrated in FIG. 2A, four photosensitive cells are arranged in two columns and two rows in each unit block. Also, each photosensitive cell has a square shape. It should be noted that this configuration is just an example and the photosensitive cells do not have to have such an arrangement or shape.

Figure 2B:
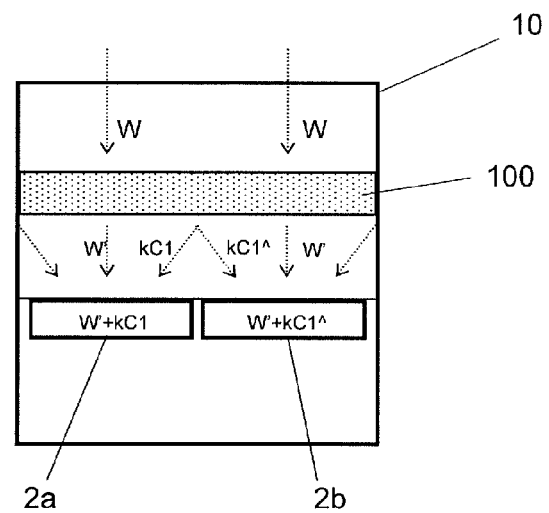
FIG. 2B A cross-sectional view as viewed on the plane A-A' shown in FIG. 2A.
Figure 2C:
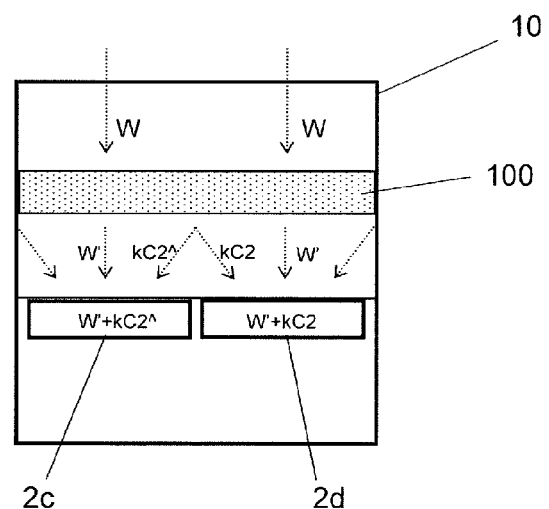
FIG. 2C A cross-sectional view as viewed on the plane B-B' shown in FIG. 2A.
Figure 2D:
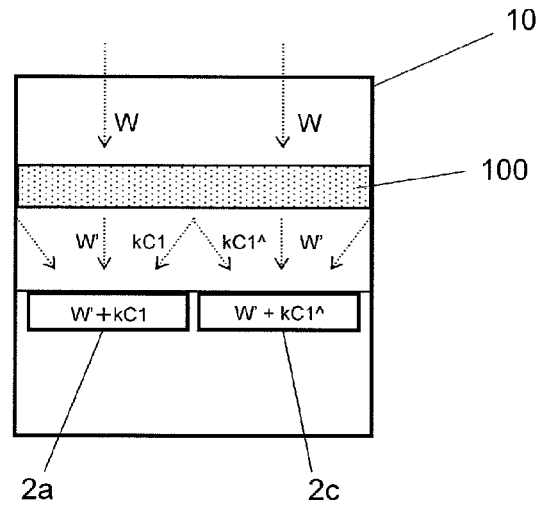
FIG. 2D A cross-sectional view as viewed on the plane C-C' shown in FIG. 2A.
Figure 2E:
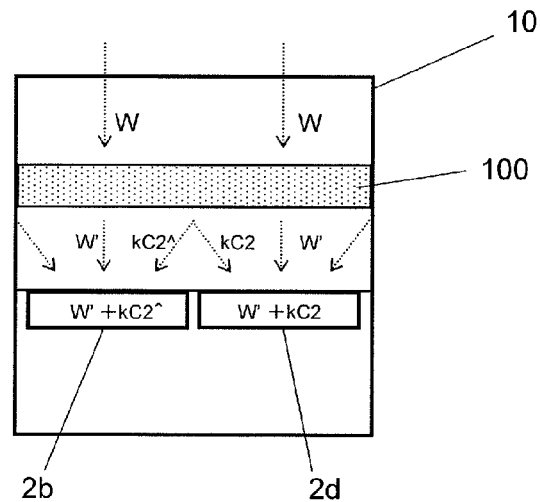
FIG. 2E A cross-sectional view as viewed on the plane D-D' shown in FIG. 2A.

FIGS. 2B, 2C, 2D and 2E are schematic cross-sectional views as respectively viewed on the planes A-A', B-B', C-C' and D-D' shown in FIG. 2A. As described above, the light dispersing element array 100 is made up of a plurality of light dispersing elements. The incoming light that has entered this light dispersing element array 100 is partially split at the ratio k by those light dispersing elements but the rest of the incoming light, represented by the ratio (1−k), is just transmitted without being split. As shown in FIGS. 2B through 2E, each incoming light ray that has entered this image sensor 10 has its traveling direction changed at the ratio k according to its color component while being transmitted through the light dispersing element array 100, and therefore, the light rays received by respective photosensitive cells have mutually different split light distributions. According to this embodiment, the light dispersing element array includes first and second types of light dispersing elements, of which the light-splitting properties are different from each other. Each light dispersing element splits incoming light into light rays to go in multiple different directions according to the color component by using refraction or diffraction. The cross-sectional views shown in FIGS. 2B and 2C illustrate how the incoming light is split horizontally (i.e., in the x direction shown in FIG. 2A), and the cross-sectional views shown in FIGS. 2D and 2E illustrate how the incoming light is split vertically (i.e., in the y direction shown in FIG. 2A).

In this description, the light that would be directly received by each photosensitive cell were it not for the light dispersing element array 1 will be referred to herein as that photosensitive cell's "entering light". If the photosensitive cells 2a through 2d included in each single unit block 40 are located close to each other, then those photosensitive cells' entering light should have almost the same light intensity distribution and substantially the same split light distribution. The intensity of the visible light component of each of those photosensitive cells' entering light will be identified herein by the sign "W". In this description, the visible light component included in the cell's entering light will be roughly classified into first, second and third color components. That is to say, if the intensities of the first, second and third color components are identified by $C_1$, $C_2$ and $C_3$, respectively, then $W=C_1+C_2+C_3$. Also, the light intensity of the cell's entering light at the ratio k will be represented as the product of the light intensity and k. Then, in each photosensitive cell's entering light, the intensity of the light split by the light dispersing element is represented by kW and the intensity of the light not to be split is represented herein by (1−k)W.

In the following description, not only the intensities of respective color components but also the color components themselves will sometimes be identified herein by $C_1$, $C_2$ and $C_3$. Also, the rest of visible light other than a particular color component will be referred to herein as the "complementary color" of that color component and a light ray in the complementary color as a "complementary color ray". Then, the complementary color of the first color component $C_1$ is represented by $C_2+C_3$, the complementary color of the second color component $C_2$ is represented by $C_1+C_3$, and the complementary color of the third color component $C_3$ is represented by $C_1+C_2$. In the following description, the complementary color of a color component $C_n$ (where $C_n$ is one of $C_1$, $C_2$ and $C_3$) and its intensity will be sometimes identified herein by $\hat{C_n}$ for convenience sake. A typical combination of the first, second and third color components consists of the three primary colors of red (R), green (G) and blue (B). However, as long as visible light can be divided into three light rays falling within mutually different wavelength ranges, any other combination of color components may be adopted as well.

Hereinafter, it will be described how the light dispersing element array 100 works in the example illustrated in FIGS. 2A through 2E. Specifically, it will be described separately how the light that is going to be incident on the first, second, third and fourth photosensitive cells 2a, 2b, 2c and 2d is split horizontally and vertically (i.e., in the x and y directions). In this case, the incoming light is split by first and second types of light dispersing elements included in the light dispersing element array 100. The first type of light dispersing element is designed so as to split the incoming light into a light ray with a first color component and a complementary color ray of the first color component. On the other hand, the second type of light dispersing element is designed so as to split the incoming light into a light ray with a second color component and a complementary color ray of the second color component.

Firstly, it will be described how the light is split horizontally with respect to the first and second photosensitive cells 2a and 2b that are arranged horizontally. The light dispersing element array 100 splits light, of which the intensity is kW that is k times as high as the intensity W of each cell's entering light of the first and second photosensitive cells 2a and 2b, into multiple light rays. Of those split light rays, the light dispersing element array 100 makes a light ray with the first color component (with an intensity $kC_1$) incident on the first photosensitive cell 2a, a complementary color ray of the first color component (with an intensity $k\hat{C_1}$) incident on the second photosensitive cell 2b, and the rest of the light that has not been split (with an intensity W' (=(1−k)W) incident on each of the first and second photosensitive cells 2a and 2b. As shown in FIG. 2B, two light rays indicated by the arrows are incident on each of the first and second photosensitive cells 2a and 2b from right- and left-hand sides, and the respective sums of those light rays are represented by $kC_1$ and $k\hat{C_1}$, respectively. In this case, the light is split by the first type of light dispersing element.

Secondly, it will be described how the light is split horizontally with respect to the third and fourth photosensitive cells 2c and 2d that are arranged horizontally. The light dispersing element array 100 splits light, of which the intensity is kW that is k times as high as the intensity W each cell's entering light of the third and fourth photosensitive cells 2c and 2d, into multiple light rays. Of those split light rays, the light dispersing element array 100 makes a light ray with the second color component (with an intensity kC2) incident on the fourth photosensitive cell 2d, a complementary color ray of the second color component (with an intensity kC2^) incident on the third photosensitive cell 2c, and the rest of the light that has not been split (with an intensity W' (=(1−k)W) incident on each of the third and fourth photosensitive cells 2c and 2d. As shown in FIG. 2C, two light rays indicated by the arrows are incident on each of the third and fourth photosensitive cells 2c and 2d from right- and left-hand sides, and the respective sums of those light rays are represented by kC2^ and kC2, respectively. In this case, the light is split by the second type of light dispersing element.

Thirdly, it will be described how the light is split vertically with respect to the first and third photosensitive cells 2a and 2c that are arranged vertically. The light dispersing element array 100 splits light, of which the intensity is kW that is k times as high as the intensity W of each cell's entering light of the first and third photosensitive cells 2a and 2c, into multiple light rays. Of those split light rays, the light dispersing element array 100 makes a light ray with the first color component (with an intensity kC1) incident on the first photosensitive cell 2a, a complementary color ray of the first color component (with an intensity kC1^) incident on the third photosensitive cell 2c, and the rest of the light that has not been split (with an intensity W' (=(1−k)W) incident on each of the first and third photosensitive cells 2a and 2c. As shown in FIG. 2D, two light rays indicated by the arrows are incident on each of the first, and third photosensitive cells 2a and 2c from right- and left-hand sides, and the respective sums of those light rays are represented by kC1 and kC1^, respectively. In this case, the light is split by the first type of light dispersing element.

Fourthly, it will be described how the light is split vertically with respect to the second and fourth photosensitive cells 2b and 2d that are arranged vertically. The light dispersing element array 100 splits light, of which the intensity is kW that is k times as high as the intensity W of each cell's entering light of the second and fourth photosensitive cells 2b and 2d, into multiple light rays. Of those split light rays, the light dispersing element array 100 makes a light ray with the second color component (with an intensity kC2) incident on the fourth photosensitive cell 2d, a complementary color ray of the second color component (with an intensity kC2^) incident on the second photosensitive cell 2b, and the rest of the light that has not been split (with an intensity W' (=(1−k)W) incident on each of the second and fourth photosensitive cells 2b and 2d. As shown in FIG. 2E, two light rays indicated by the arrows are incident on each of the second and fourth photosensitive cells 2b and 2d from right- and left-hand sides, and the respective sums of those light rays are represented by kC2^ and kC2, respectively. In this case, the light is split by the first type of light dispersing element.

As it has been described separately how the light rays to be incident on the respective photosensitive cells are split horizontally and vertically, the intensity W' of the light that has not been split has been mentioned four times. Actually, however, each of those photosensitive cells receives that light with the intensity W' only once as, the light that has not been split.

Figure 2F:
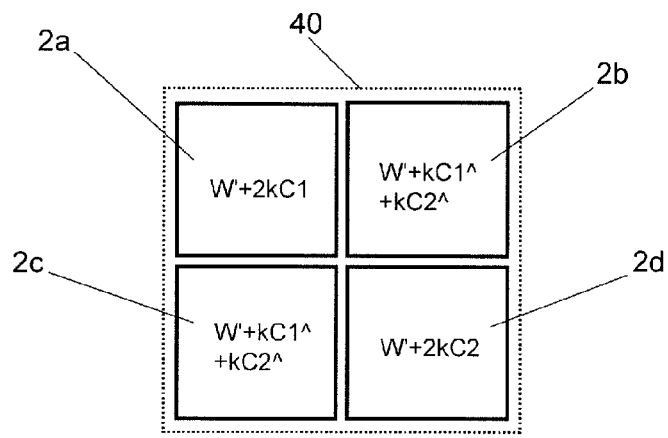
FIG. 2F Shows the intensities of the combined light rays received by the respective photosensitive cells in the configuration shown in FIGS. 2A through 2E.

FIG. 2F shows the intensities of the combined light rays received by the respective photosensitive cells. According to the configuration described above, if attention is paid to only the split light rays, the photosensitive cells 2a, 2b, 2c and 2d receive light rays, of which the intensities are represented by kC1, kC1^, kC2^ and kC2, respectively, as a result of horizontal light splitting and also receive light rays, of which the intensities are represented by kC1, kC2^, kC1^ and kC2, respectively, as a result of vertical light splitting. In addition, each of those photosensitive cells also receives the non-split light with the intensity W'. Consequently, the photosensitive cells 2a, 2b, 2c and 2d receive light rays, of which the intensities are represented by W'+2kC1, W'+kC1^+kC2^, W'+kC1^+kC2^ and W'+2kC2, respectively, as shown in FIG. 2F. And the respective photosensitive cells output photoelectrically converted signals (pixel signals) representing these intensities.

In this description, the photoelectrically converted signals output from the photosensitive cells 2a to 2d will be identified herein by S2a, S2b, S2c and S2d, respectively, and signals representing the intensities W, W', C1, C2, C3, C1^, C2^ and C3^ will be identified herein by Ws, W's, C1s, C2s, C3s, C1^s (=C2s+C3s), C2^s (=C1s+C3s) and C3^s (=C1s+C2s), respectively. And Ws=C1s+C2s+C3s is supposed to be satisfied. Then S2a, S2b, S2c and S2d are represented by the following Equations (1) to (4), respectively:

$$S2a = W's + 2kC1s \tag{1}$$

$$S2b = Ws' + kC1^s + kC2^s = Ws' + kWs + kC3s \tag{2}$$

$$S2c = Ws' + kC1^s + kC2^s = Ws' + kWs + kC3s \tag{3}$$

$$S2d = W's + 2kC2s \tag{4}$$

If these signals S2a to S2d are added together, 4Ws'+2kC1s 2kC1^s+2kC2s+2kC2^s=4Ws'+4 kWs=4(1−k)Ws+4 kWs=4Ws is satisfied. Thus, it can be seen that no optical loss has been caused.

In this case, the ratio k of the split light rays to the entire incoming light is a designed value and already known. That is why if the average of the signals S2a through S2d is Sav (=Ws), C1s can be obtained by subtracting (1−k)Sav from the signal S2a and by dividing the remainder by 2k. In the same way, C2s can be obtained by subtracting (1−k)Sav from the signal S2d and by dividing the remainder by 2k. And C3s can be obtained by subtracting 2Sav from the signal (S2b+S2c) and by dividing the remainder by 2k. After all, the color signals C1s, C2s and C3s can be obtained by performing the arithmetic operations represented by the following Equations (5) to (7):

$$C1s = (S2a - (1-k)Sav)/2k \tag{5}$$

$$C2s = (S2d - (1-k)Sav)/2k \tag{6}$$

$$C3s = (S2b + S2c - 2Sav)/2k \tag{7}$$

That is to say, a color signal can be calculated by performing signal arithmetic operations based on the four photoelectrically converted signals S2a through S2d supplied from the respective photosensitive cells 2a through 2d. Next, another example of the image sensor 10 will be described with reference to FIGS. 3A through 3F.

Figure 3A:
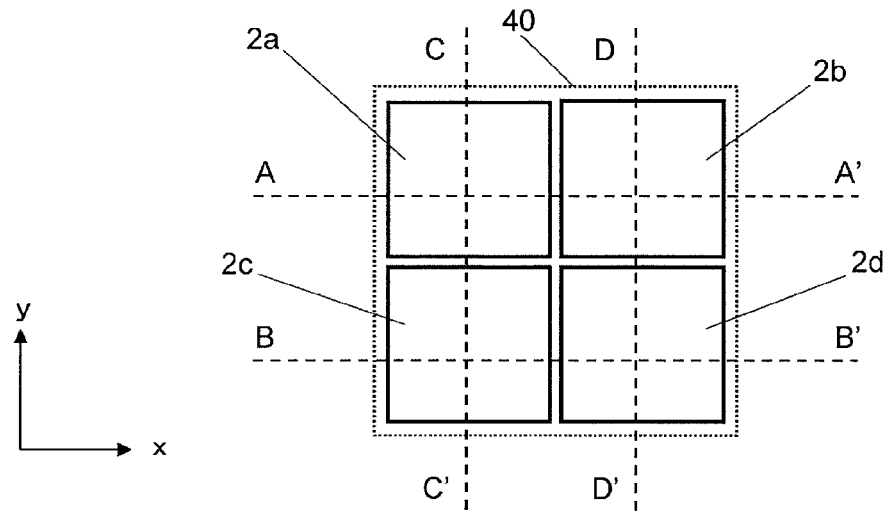
FIG. 3A A plan view illustrating an exemplary unit block of a solid-state image sensor according to another embodiment of the present invention.

FIG. 3A is a plan view illustrating a unit block 40 of the photosensitive cell array 200 of this example, which has the same configuration as the one shown in FIG. 2A.

FIGS. 3B, 3C, 3D and 3E are schematic cross-sectional views as respectively viewed on the planes A-A', B-B', C-C' and D-D' shown in FIG. 3A. In this example, the light dispersing element array 100 includes first and second types of light dispersing elements. The first type of light dispersing element splits the incoming light into a part of light rays with the first color component, a part of the rest of the light ray with the first color component, and a complementary color ray of the light ray with the first color component. The second type of light dispersing element splits the incoming light into a part of light rays with the second color component, a part of the rest of the light ray with the second color component, and a complementary color ray of the light ray with the second color component. Hereinafter, it will be separately described how the light that is going to be incident on the respective photosensitive cells is split horizontally and vertically.

Figure 3B:
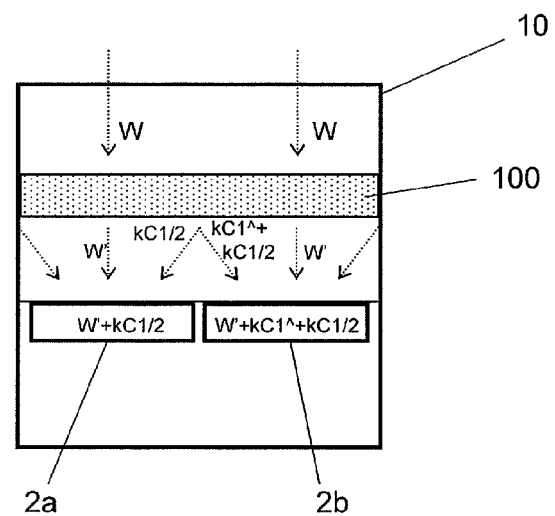
FIG. 3B A cross-sectional view as viewed on the plane A-A' shown in FIG. 3A.

Firstly, it will be described how the light is split horizontally with respect to the first and second photosensitive cells 2a and 2b that are arranged horizontally. The light dispersing element array 100 splits light, of which the intensity is kW that is k times as high as the intensity W of each cell's entering light of the first and second photosensitive cells 2a and 2b, into multiple light rays. Of those split light rays, the light dispersing element array 100 makes one half of a light ray with the first color component (with an intensity kC1/2) incident on the first photosensitive cell 2a, the other half of the light ray with the first color component (with an intensity kC1/2) and a complementary color ray of the first color component (with an intensity kC1^) incident on the second photosensitive cell 2b, and the rest of the light that has not been split (with an intensity W' (=(1−k)W) incident on each of the first and second photosensitive cells 2a and 2b. As shown in FIG. 3B, two light rays indicated by the arrows are incident on each of the first and second photosensitive cells 2a and 2b from right- and left-hand sides, and the respective sums of those light rays are represented by kC1/2 and kC1^ kC1/2, respectively. In this case, the light is split by the first type of light dispersing element.

Figure 3C:
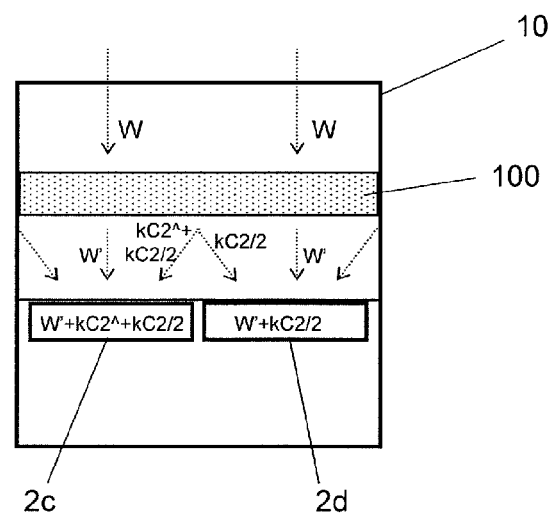
FIG. 3C A cross-sectional view as viewed on the plane B-B' shown in FIG. 3A.

Secondly, it will be described how the light is split horizontally with respect to the third and fourth photosensitive cells 2c and 2d that are arranged horizontally. The light dispersing element array 100 splits light, of which the intensity is kW that is k times as high as the intensity W of each cell's entering light of the third and fourth photosensitive cells 2c and 2d, into multiple light rays. Of those split light rays, the light dispersing element array 100 makes one half of a light ray with the second color component (with an intensity kC2/2) incident on the fourth photosensitive cell 2d, the other half of the light ray with the second color component (with an intensity kC2/2) and a complementary color ray of the second color component (with an intensity kC2^) incident on the third photosensitive cell 2c, and the rest of the light that has not been split (with an intensity W' (=(1−k)W) incident on each of the third and fourth photosensitive cells 2c and 2d. As shown in FIG. 3C, two light rays indicated by the arrows are incident on each of the third and fourth photosensitive cells 2c and 2d from right- and left-hand sides, and the respective sums of those light rays are represented by kC2^+kC2/2 and kC2/2, respectively. In this case, the light is split by the second type of light dispersing element.

Figure 3D:
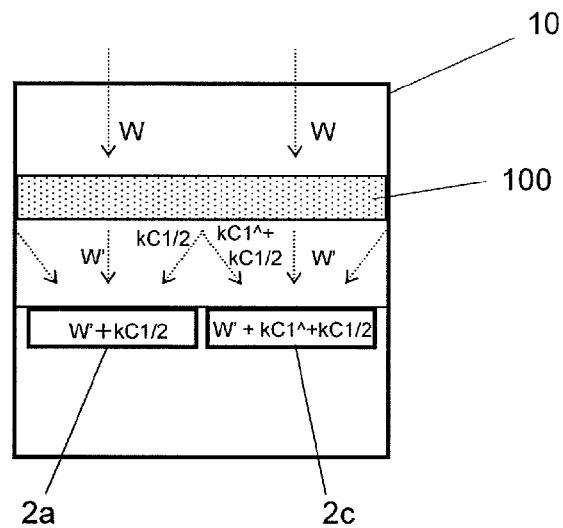
FIG. 3D A cross-sectional view as viewed on the plane C-C' shown in FIG. 3A.

Thirdly, it will be described how the light is split vertically with respect to the first and third photosensitive cells 2a and 2c that are arranged vertically. The light dispersing element array 100 splits light, of which the intensity is kW that is k times as high as the intensity W of each cell's entering light of the first and third photosensitive cells 2a and 2c, into multiple light rays. Of those split light rays, the light dispersing element array 100 makes one half of a light ray with the first color component (with an intensity kC1/2) incident on the first photosensitive cell 2a, the other half of the light ray with the first color component (with an intensity kC1/2) and a complementary color ray of the first color component (with an intensity kC1^) incident on the third photosensitive cell 2c, and the rest of the light that has not been split (with an intensity W' (=(1−k)W) incident on each of the first and third photosensitive cells 2a and 2c. As shown in FIG. 3D, two light rays indicated by the arrows are incident on each of the first and third photosensitive cells 2a and 2c from right- and left-hand sides, and the respective sums of those light rays are represented by kC1/2 and kC1^+kC1/2, respectively. In this case, the light is split by the first type of light dispersing element.

Figure 3E:
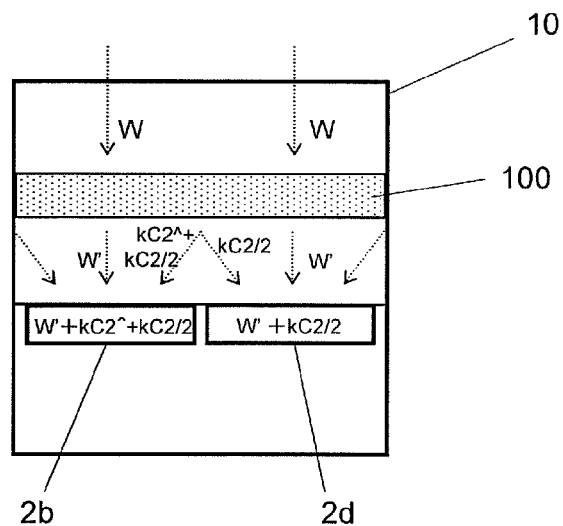
FIG. 3E A cross-sectional view as viewed on the plane D-D' shown in FIG. 3A.

Fourthly, it will be described how the light is split vertically with respect to the second and fourth photosensitive cells 2b and 2d that are arranged vertically. The light dispersing element array 100 splits light, of which the intensity is kW that is k times as high as the intensity W of each cell's entering light of the second and fourth photosensitive cells 2b and 2d, into multiple light rays. Of those split light rays, the light dispersing element array 100 makes one half of a light ray with the second color component (with an intensity kC2/2) incident on the fourth photosensitive cell 2d, the other half of the light ray with the second color component (with an intensity kC2/2) and a complementary color ray of the second color component (with an intensity kC2^) incident on the second photosensitive cell 2b, and the rest of the light that has not been split (with an intensity W' (=(1−k)W) incident on each of the second and fourth photosensitive cells 2b and 2d. As shown in FIG. 3E, two light rays indicated by the arrows are incident on each of the second and fourth photosensitive cells 2b and 2d from right- and left-hand sides, and the respective sums of those light rays are represented by kC2^ kC2/2 and kC2/2, respectively. In this case, the light is split by the second type of light dispersing element.

As it has been described separately how the light rays to be incident on the respective photosensitive cells are split horizontally and vertically, the intensity W' of the light that has not been split has been mentioned four times. Actually, however, each of those photosensitive cells receives that light with the intensity W' only once as the light that has not been split.

Figure 3F:
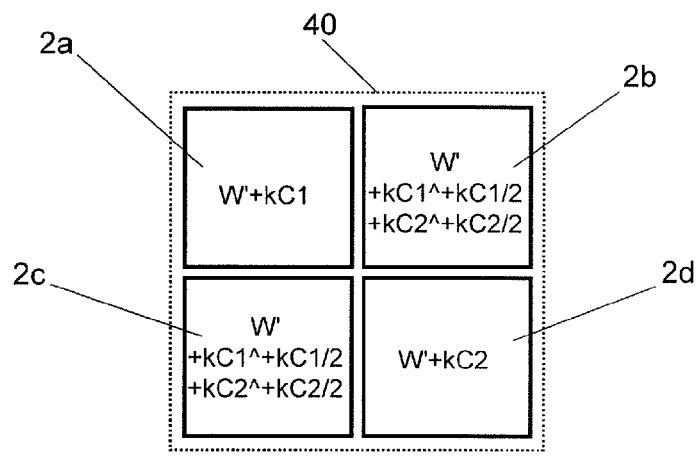
FIG. 3F Shows the intensities of the combined light rays received by the respective photosensitive cells in the configuration shown in FIGS. 3A through 3E.

FIG. 3F shows the intensities of the combined light rays received by the respective photosensitive cells. According to the configuration described above, the photosensitive cells 2a, 2b, 2c and 2d receive light rays, of which the intensities are represented by W'+kC1, W'+kC1^+kC1/2+kC2^+kC2/2, W'+kC1^+kC1/2+kC2^+kC2/2 and W'+kC2, respectively. Consequently, the respective photosensitive cells output photoelectrically converted signals (pixel signals) representing these intensities.

The photoelectrically converted signals S2a through S2d output by the photosensitive cells 2a through 2d can be represented by the following Equations (8) through (11), respectively:

$$S2a = W's + kC1s \tag{8}$$

$$S2b = W's + kC1\hat{\,}s + kC1s/2 + kC2\hat{\,}s + kC2s/2 \tag{9}$$

$$S2c = W's + kC1\hat{\,}s + kC1s/2 + kC2\hat{\,}s + kC2s/2 \tag{10}$$

$$S2d = W's + kC2s \tag{11}$$

If these signals S2a to S2d are added together, 4W's+2kC1s+2kC1^s+2kC2s+2kC2^s=4W's+4 kWs=4Ws is satisfied. Thus, it can be seen that no optical loss has been caused. In this case, since the ratio k is also a designed value and already known, the color signals C1s, C2s and C3s can be obtained by Equations (8) through (11).

As can be seen, a color signal can also be calculated by performing signal arithmetic operations based on the four photoelectrically converted signals S2a through S2d supplied from the respective photosensitive cells 2a through 2d.

The image sensor 10 of this embodiment can obtain color information through such signal arithmetic operations by using light dispersing elements instead of color filters that absorb a part of incoming light. As a result, the loss of the light can be minimized and the image capturing sensitivity can be increased.

In FIGS. 1, 2B through 2E, and 3B through 3E, the light dispersing element array 100 is illustrated as a single continuous member that covers multiple photosensitive cells. However, the light dispersing element array 4 may also be a set of spatially separated light dispersing elements. Examples of such light dispersing elements include a high-refractive-index transparent member, a dichroic mirror and a micro prism as will be described later. Nevertheless, as long as the photoelectrically converted signals of the examples described above are obtained, the light dispersing element array 100 of this embodiment may also have any other arrangement. For example, the incoming light may be split with a hologram element, for example.

Hereinafter, specific embodiments will be described with reference to FIGS. 4 through 8. In the following description, any pair of components having substantially the same function will be identified by the same reference numeral.

Embodiment 1

Figure 4:
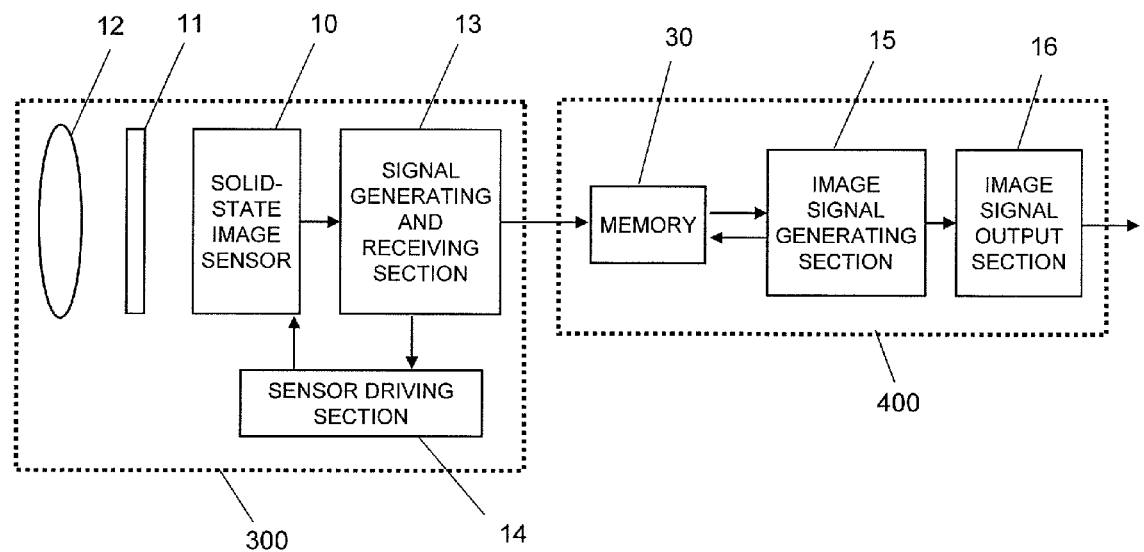
FIG. 4 A block diagram illustrating a general configuration for an image capture device as first embodiment of the present invention.

FIG. 4 is a block diagram illustrating an overall configuration for an image capture device as a first embodiment. The image capture device of this embodiment is a digital electronic camera and includes an image capturing section 300 and a signal processing section 400 that receives a signal from the image capturing section 300 and outputs a signal representing an image (i.e., an image signal). The image capture device may either generate only a still picture or have the function of generating a moving picture.

The image capturing section 300 includes an optical lens 12 which images a given subject, an optical filter 11, and a solid-state image sensor 10 (which will be simply referred to herein as an "image sensor") which converts the optical information that has been gotten through the optical lens 12 and the optical filter 11 into an electrical signal by photoelectric conversion. The image capturing section 300 further includes a signal generating and receiving section 13 which not only generates a fundamental signal to drive the image sensor 10 but also receives the output signal of the image sensor 10 and sends it to the signal processing section 400 and a sensor driving section 14 which drives the image sensor 10 in accordance with the fundamental signal generated by the signal generating and receiving section 13. The optical lens 12 is a known lens and may be a lens unit including multiple lenses. The optical filters 11 are a combination of a quartz crystal low-pass filter which reduces a moiré pattern to be caused by a pixel arrangement with an infrared cut filter which filters out infrared rays. The image sensor 10 is typically a CMOS or a CCD, and may be fabricated by known semiconductor device processing technologies. The signal generating and receiving section 13 and the sensor driving section 14 may be implemented as an LSI such as a CCD driver.

The signal processing section 400 includes an image signal generating section 15 which generates an image signal by processing the signal supplied from the image capturing section 300, a memory 30 which stores various kinds of data that have been produced while the image signal is being generated, and an image signal output section 16 which sends out the image signal thus generated to an external device. The image signal generating section 15 is suitably a combination of a hardware component such as a known digital signal processor (DSP) and a software program for use to perform image processing involving the image signal generation. The memory 30 may be a DRAM, for example. And the memory 30 not only stores the signal supplied from the image capturing section 300 but also temporarily retains the image data that has been generated by the image signal generating section 15 or compressed image data. These image data are then output to either a storage medium or a display section (neither is shown) by way of the image signal output section 16.

The image capture device of this embodiment actually further includes an electronic shutter, a viewfinder, a power supply (or battery), a flashlight and other known components. However, description thereof will be omitted herein because none of them are essential components that would make it difficult to understand how the present invention works unless they were described in detail. It should also be noted that this configuration is just an example. Rather, this embodiment may also be carried out as any other appropriate combination of known elements as longus the image sensor 10 and the image signal generating section 15 are included.

Hereinafter, the solid-state image sensor 10 this embodiment will be described.

Figure 5:
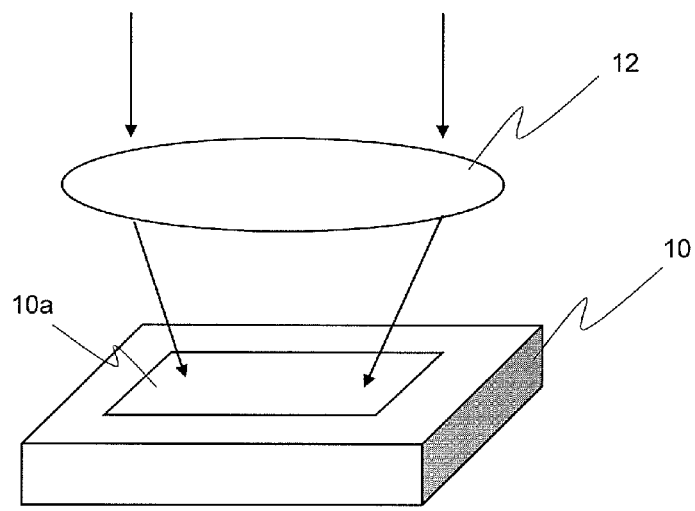
FIG. 5 Illustrates how a lens and an image sensor may be arranged in the first embodiment of the present invention.

FIG. 5 schematically illustrates how the light that has been transmitted through the lens 12 is incident on the image sensor 10 during an exposure process. In FIG. 5, shown are only the lens 12 and the image sensor 10 with illustration of the other components omitted for the sake of simplicity. Also, although the lens 12 actually often consists of a number of lenses that are arranged in the optical axis direction, the lens 12 shown in FIG. 5 is illustrated as a single lens in a simplified form. On the imaging area 10a of the image sensor 10, arranged two-dimensionally are a plurality of photosensitive cells (pixels) that form a photosensitive cell array. Those photosensitive cells are typically photodiodes, each of which outputs, as a pixel signal, a photoelectrically converted signal representing the intensity of the light received (which will be referred to herein as an "incident light intensity"). The light (visible light) that has been transmitted through the lens 12 and the optical filter 11 is incident on the imaging area 10a. Generally speaking, the intensity of the light impinging on the imaging area 10a and the distribution of the quantities of incoming light rays that fall within multiple different wavelength ranges (which will be referred to herein as a "split light distribution") vary from one point of incidence to another.

Figure 6A:
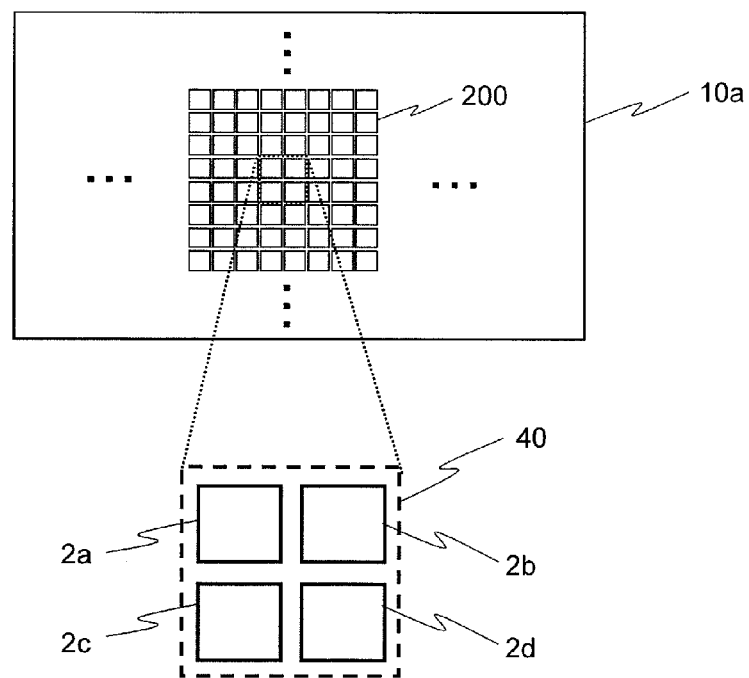
FIG. 6A Illustrates an exemplary pixel arrangement for an image sensor according to the first embodiment of the present invention.
Figure 6B:
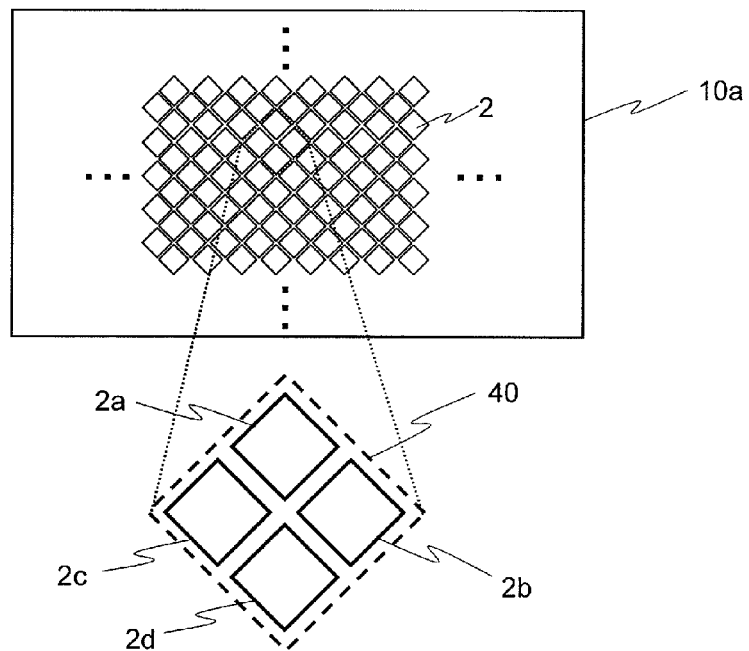
FIG. 6B Illustrates another exemplary pixel arrangement for an image sensor according to the first embodiment of the present invention.

FIGS. 6A and 6B are plan views illustrating arrangements of pixels according to this embodiment. As shown in FIG. 6A, the photosensitive cell array 200 may be made up of a number of photosensitive cells that are arranged on the imaging area 10a to form a tetragonal lattice. The photosensitive cell array 200 is divided into a number of unit blocks 40, each of which consists of four photosensitive cells 2a, 2b, 2c and 2d. Alternatively, the photosensitive cells may also have an oblique lattice arrangement as shown in FIG. 6B, instead of the tetragonal lattice arrangement shown in FIG. 6A, or any other appropriate arrangement. Furthermore, in this embodiment, the four photosensitive cells 2a to 2d included in each unit block are arranged close to each other as shown in FIGS. 6A and 6B. However, even if those photosensitive cells 2a to 2d were well spaced from each other, color information could still be obtained by forming appropriately the light dispersing element array to be described later. If necessary, each unit block may even have five or more photosensitive cells as well.

The light dispersing element array consisting of multiple light dispersing elements is arranged on the light incident side so as to face the photosensitive cell array 200. According to this embodiment, four light dispersing elements are arranged so as to respectively face the four photosensitive cells that are included in each unit block. Also, according to this embodiment, the first type of light dispersing element 1a is arranged so as to cover at least partially the boundaries surrounding the first photosensitive cell 2a, and the second type of light dispersing element 1b is arranged so as to cover at least partially the boundaries surrounding the fourth photosensitive cell 2d.

Hereinafter, the light dispersing elements of this embodiment will be described.

The light dispersing element of this embodiment is an optical element which refracts incoming light to multiple different directions according to the wavelength range by utilizing diffraction of the light to produce on the boundary between two different light-transmitting members with mutually different refractive indices. The light dispersing element of that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially separated according to the wavelength range into multiple light rays with respective color components. For example, one and the other halves of a light ray with a first color component can be refracted toward first and second directions, respectively, and a light ray with a color component other than the first color component can be refracted toward a third direction. Alternatively, three light rays falling within mutually different wavelength ranges (i.e., having mutually different color components) could be refracted toward three different directions, too. Since the incoming light can be split due to the difference in refractive index between the core and clad portions, the high-refractive-index transparent portion will sometimes be referred to herein as a "light dispersing element". Such diffractive light dispersing elements are disclosed in Japanese Patent Publication No. 4264465, for example.

A light dispersing element array, including such light dispersing elements, may be fabricated by performing thin-film deposition and patterning processes by known semiconductor device processing technologies. By appropriately determining the material (and refractive index), shape, size and arrangement pattern of the light dispersing elements, multiple light rays falling within intended wavelength ranges can be made to be incident on respective photosensitive cells either separately from each other or combined together. As a result, signals representing required color components can be calculated based on a set of photoelectrically converted signals supplied from the respective photosensitive cells.

Figure 7A:
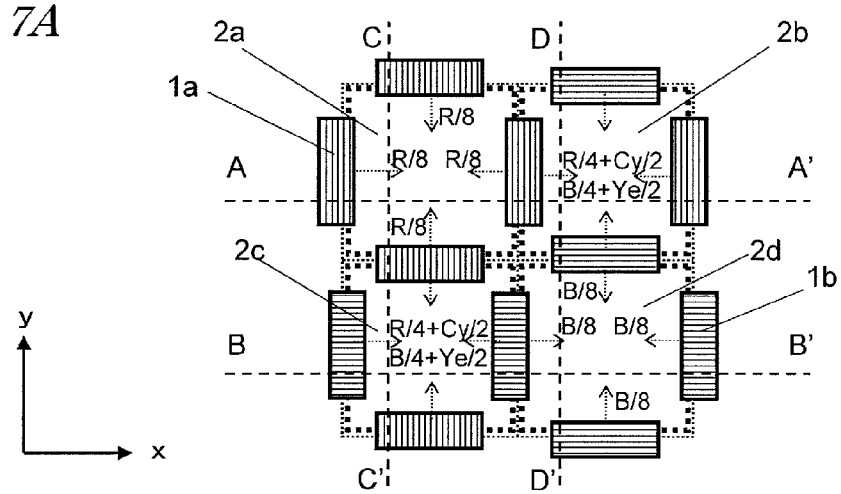
FIG. 7A A plan view illustrating the basic structure of an image sensor according to the first embodiment of the present invention.

Hereinafter, it will be described with reference to FIGS. 7A through 7F what the basic structure of the image sensor 10 of this embodiment is like and how the light dispersing elements work. In this embodiment, the image sensor is supposed to be a backside illumination type. However, according to this embodiment, it does not matter whether the image sensor 10 is a backside illumination type or a surface illumination type, and therefore, the image sensor may be a surface illumination type as well. Also, according to this embodiment, the image sensor has a cell pitch of about 4 μm both horizontally and vertically and has relatively high sensitivity. FIGS. 7A through 7E illustrate the basic structure of the image sensor 10 of this embodiment. Specifically, FIG. 7A is a plan view illustrating the basic structure of the image sensor 10. In each unit block, light dispersing elements 1a and 1b are arranged near the boundaries between the four photosensitive cells 2a, 2b, 2c and 2d so as to face those photosensitive cells 2a, 2b, 2c and 2d. A number of basic structures, each having the same arrangement pattern like this, are arranged over the entire imaging area 10a.

FIGS. 7B, 7C, 7D and 7E are cross-sectional views of the image sensor 10 shown in FIG. 7A as viewed on the planes A-A', B-B', C-C' and D-D', respectively. As shown in FIGS. 7B through 7E, the image sensor 10 includes: a semiconductor substrate 7 made of silicon or any other suitable material; photosensitive cells 2a through 2d which are arranged in the semiconductor substrate 7; a transparent layer 6a on the back surface of the semiconductor substrate 7 (i.e., on the light incident side); and plate-like high-refractive-index transparent members 1a, 1b arranged in the transparent layer 6a. An interconnect layer 5 has been formed on the principal surface of the semiconductor substrate 7 (i.e., opposite from the light incident side). On the principal surface, also arranged is a fixing base 9 which supports the semiconductor substrate 7 and the interconnect layer 5. The fixing base 9 is bonded to the semiconductor substrate 7 with another transparent layer 6b interposed between them. In this embodiment, the high-refractive-index transparent members 1a and 1b function as light dispersing elements.

The structure shown in FIGS. 7A through 7E can be fabricated by known semiconductor device processing technologies. The image sensor 10 shown in FIGS. 7A through 7E has a backside illumination type structure in which light that has come from the other side, opposite from the interconnect layer 5, is incident on respective photosensitive cells. However, the image sensor 10 of this embodiment does not have to have such a structure but may also have a surface illumination type structure that receives the light that has come from over the surface of the interconnect layer 5.

As shown in FIGS. 7B through 7E, the first and second types of light dispersing elements 1a and 1b have a rectangular cross section which is elongate in the light transmitting direction, and split the incoming light by using the difference in refractive index between themselves and the transparent layer 6a. The light dispersing elements 1a are arranged over the boundaries with the other photosensitive cells so as to surround the photosensitive cell 2a. On the other hand, the light dispersing elements 1b are arranged over the boundaries with the other photosensitive cells so as to surround the photosensitive cell 2d. Each light dispersing element 1a splits the incoming light into a cyan (Cy) ray to go straight down and two R rays (each having a light intensity R/8) to go obliquely down to the right and to the left. Meanwhile, each light dispersing element 1b splits the incoming light into a yellow (Ye) ray to go straight down and two B rays (each having a light intensity B/4) to go obliquely down to the right and to the left. These light dispersing elements 1a and 1b should be suitably used for an image sensor with a photosensitive cell pitch of about 1 μm. The image sensor of this embodiment has a photosensitive cell pitch of as large as 4 μm, and therefore, does not split the entire incoming light but splits approximately 50% of the incoming light. In FIGS. 7A through 7E, the intensity of the light to be incident on the respective photosensitive cells is indicated by W, and the intensity of the light not to be split is indicated by W' (=0.5W). As can be seen, according to this embodiment, the light splitting ratio k is ½. As for the color components of the split light rays, the light intensities of the red, green, blue, yellow and cyan rays are indicated by R, G, B, Ye and Cy, respectively.

Next, it will be described with reference to FIG. 7A how the incoming light is split. The light dispersing element 1a makes four red (R) rays, each having an intensity of R/8, incident on the photosensitive cell 2a from over, from under, from the left-hand side of, and from the right-hand side of the photosensitive cell 2a. On the other hand, the light dispersing element 1b makes four blue (B) rays, each having an intensity of B/8, incident on the photosensitive cell 2d from over, from under, from the left-hand side of, and from the right-hand side of the photosensitive cell 2d. As a result, R rays with a combined intensity of R/2 are incident on the photosensitive cell 2a from the four surrounding light dispersing elements 1a, and B rays with a combined intensity of B/2 are incident on the photosensitive cell 2d from the four surrounding light dispersing elements 1b. Meanwhile, light rays with an overall intensity of R/4+Cy/2+B/4+Ye/2 are incident on each of the photosensitive cells 2b and 2c through those two types of light dispersing elements. Even though the intensity of the light that is not split is not shown in FIG. 7A, a light ray with a light intensity W' is incident on each photosensitive cell.

Figure 7B:
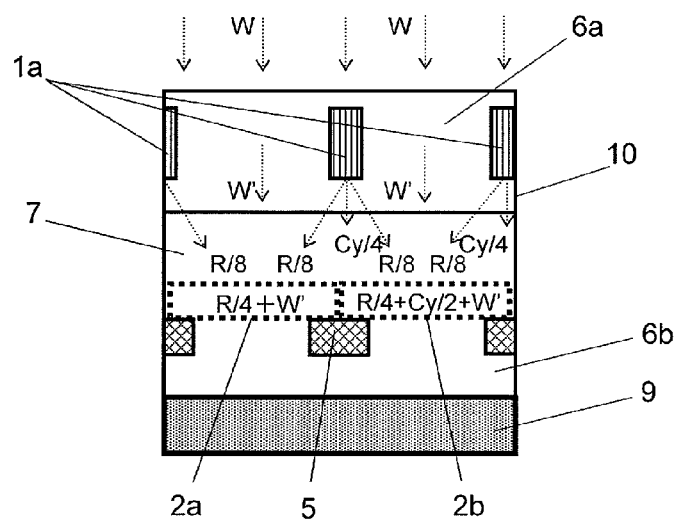
FIG. 7B A cross-sectional view as viewed on the plane A-A' shown in FIG. 7A.

Next, it will be described more specifically with reference to FIGS. 7B through 7E how the incoming light is split. FIG. 7B is a cross-sectional view as viewed on the plane A-A' shown in FIG. 7A and illustrates how the light dispersing elements 1a split the incoming light and make parts of the split light rays incident on the photosensitive cells 2a and 2b. In this embodiment, the light dispersing elements 1a are not arranged right over the boundaries between the photosensitive cells 2a and 2b but are somewhat shifted toward the photosensitive cell 2b. As a result, two R rays, each having an intensity of R/8 (i.e., a combined intensity of R/4), are incident on the photosensitive cell 2a from the light dispersing elements 1a on the right- and left-hand sides. On the other hand, R and Cy rays, each having an intensity of R/8+Cy/4 (i.e., a combined intensity of R/4+Cy/2), are incident on the photosensitive cell 2b from the light dispersing elements 1a on the right- and left-hand sides. In addition, light W' (=W/2) that has not been split is also incident on each of the photosensitive cells 2a and 2b.

Figure 7C:
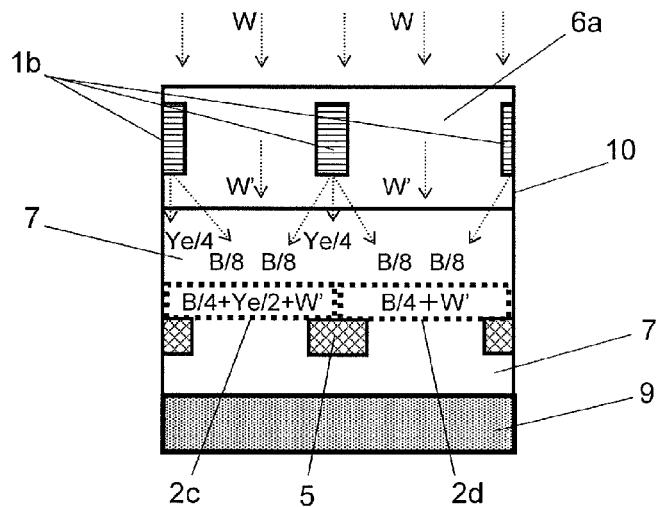
FIG. 7C A cross-sectional view as viewed on the plane B-B' shown in FIG. 7A.

FIG. 7C is a cross-sectional view as viewed on the plane B-B' shown in FIG. 7A and illustrates how the light dispersing elements 1b split the incoming light and make parts of the split light rays incident on the photosensitive cells 2c and 2d. In this embodiment, the light dispersing elements 1b are not arranged right over the boundaries between the photosensitive cells 2c and 2d but are somewhat shifted toward the photosensitive cell 2c. As a result, two B rays, each having an intensity of B/8 (i.e., a combined intensity of B/4), are incident on the photosensitive cell 2d from the light dispersing elements 1b on the right- and left-hand sides. On the other hand, B and Ye rays, each having an intensity of B/8+Ye/4 (i.e., a combined intensity of B/2+Ye/2), are incident on the photosensitive cell 2c from the light dispersing elements 1b on the right- and left-hand sides. In addition, light W' (=W/2) that has not been split is also incident on each of the photosensitive cells 2c and 2d.

Figure 7D:
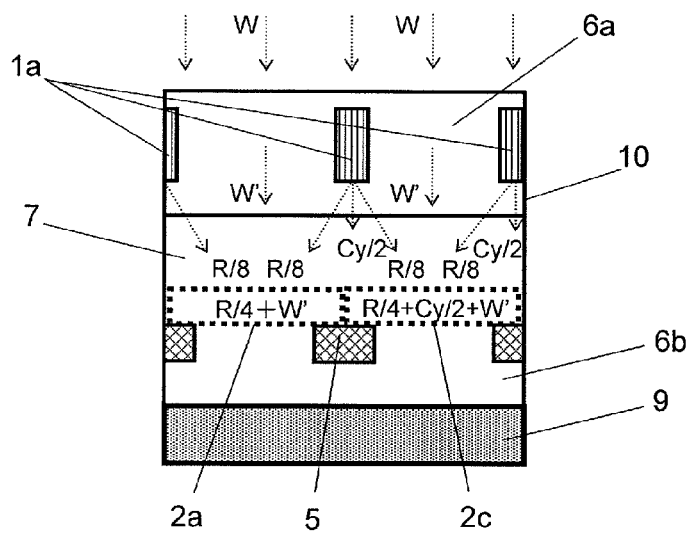
FIG. 7D A cross-sectional view as viewed on the plane C-C' shown in FIG. 7A.

FIG. 7D is a cross-sectional view as viewed on the plane C-C' shown in FIG. 7A and illustrates how the light dispersing elements 1a split the incoming light and make parts of the split light rays incident on the photosensitive cells 2a and 2c. In this embodiment, the light dispersing elements 1a are not arranged right over the boundaries between the photosensitive cells 2a and 2c but are somewhat shifted toward the photosensitive cell 2c. As a result, two R rays, each having an intensity of R/8 (i.e., a combined intensity of R/4), are incident on the photosensitive cell 2a from the light dispersing elements 1a on the right- and left-hand sides. On the other hand, R and Cy rays, each having an intensity of R/8+Cy/4 (i.e., a combined intensity of R/4+Cy/2), are incident on the photosensitive cell 2c from the light dispersing elements 1b on the right- and left-hand sides. In addition, light W' (=W/2) that has not been split is also incident on each of the photosensitive cells 2a and 2c.

Figure 7E:
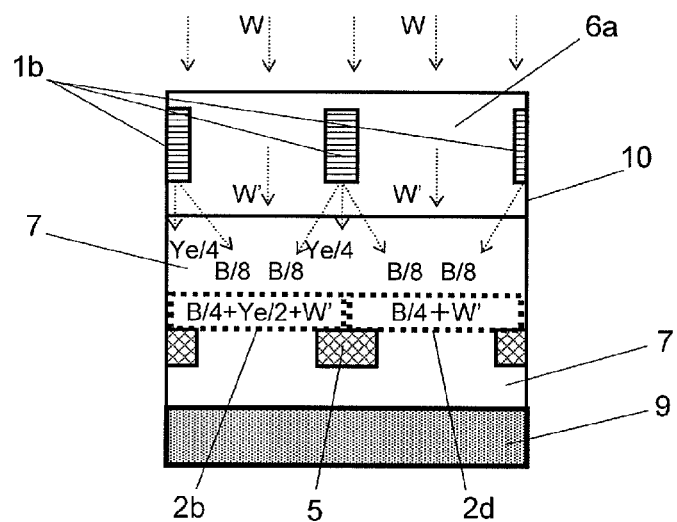
FIG. 7E A cross-sectional view as viewed on the plane D-D' shown in FIG. 7A.

FIG. 7E is a cross-sectional view as viewed on the plane D-D' shown in FIG. 7A and illustrates how the light dispersing elements 1b split the incoming light and make parts of the split light rays incident on the photosensitive cells 2b and 2d. In this embodiment, the light dispersing elements 1b are not arranged right over the boundaries between the photosensitive cells 2b and 2d but are somewhat shifted toward the photosensitive cell 2b. And the lower end of the light dispersing elements 1b is slightly shifted toward its center. As a result, two B rays, each having an intensity of B/8 (i.e., a combined intensity of B/4), are incident on the photosensitive cell 2d from the light dispersing elements 1b on the right- and left-hand sides. On the other hand, B and Ye rays, each having an intensity of B/8+Ye/4 (i.e., a combined intensity of B/4+Ye/2), are incident on the photosensitive cell 2b from the light dispersing elements 1b on the right- and left-hand sides. In addition, light W' (=W/2) that has not been split is also incident on each of the photosensitive cells 2b and 2d.

Figure 7F:
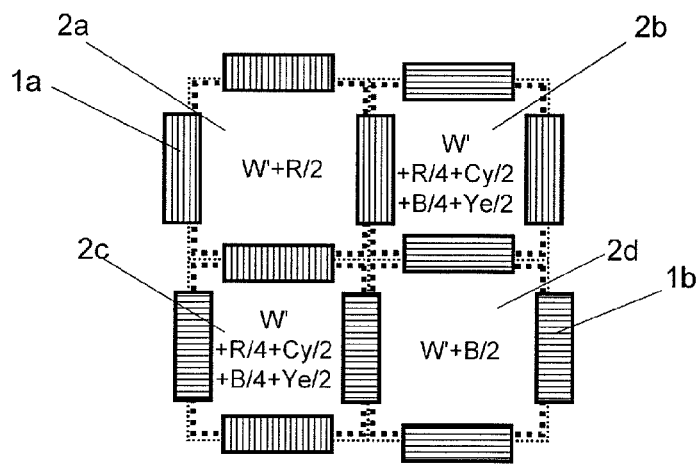
FIG. 7F Shows the intensities of the combined light rays received by the respective photosensitive cells in the configuration shown in FIGS. 7A through 7E.

FIG. 7F shows the respective intensities of the light rays incident on those photosensitive cells. By adopting the configuration described above, light rays with the intensities W'+R/2, W'+R/4+Cy/2+B/4+Ye/2, W'+R/4+Cy/2+B/4+Ye/2, and W'+B/4 are incident on the photosensitive cells 2a, 2b, 2c and 2d if the non-split light W' is also taken into account.

Since the light dispersing elements 1a and 1b have such a property and are arranged to split the incoming light as described above, the photosensitive cells 2a through 2d output photoelectrically converted signals S2a through S2d represented by the following Equations (12) through (15). In this case, signals representing the intensities of red, green and blue rays are indicated by Rs, Gs and Bs, respectively, a signal Cs representing the intensity of a cyan ray is indicated by Gs+Bs, and a signal Ys representing the intensity of a yellow ray is indicated by Rs+Gs:

$$S2a = W's + Rs/2 \tag{12}$$

$$S2b = W's + Rs/4 + Bs/4 + (Gs+Bs)/2 + (Rs+Gs)/2 = 5W's/2 + Gs/4 \tag{13}$$

$$S2c = W's + Rs/4 + Bs/4 + (Gs+Bs)/2 + (Rs+Gs)/2 = 5W's/2 + Gs/4 \tag{14}$$

$$S2d = W's + Bs/2 \tag{15}$$

As a result, Rs can be obtained by subtracting W's from S2a and multiplying the remainder by two. Bs can be obtained by subtracting W's from S2d and multiplying the remainder by two. Gs can be obtained by subtracting 5W's from the sum of S2b and S2c and multiplying the remainder by two. W's is obtained by dividing the average Say of S2a through S2d by two, and Say is represented by the following Equation (16). That is to say, by performing the arithmetic operations represented by the following Equations (16) through (19), the color signals Rs, Gs and Bs can be obtained.

$$Sav = (S2a + S2b + S2c + S2d)/4 \tag{16}$$

$$Rs = 2(S2a - Sav/2) \tag{17}$$

$$Gs = 2((S2b + S2c) - 5Sav/2) \tag{18}$$

$$Bs = 2(S2d - Sav/2) \tag{19}$$

The image signal generating section 15 (see FIG. 4) generates color information by performing arithmetic operations on the photoelectrically converted signals represented by Equations (16) through (19). Hereinafter, it will be described with reference to FIG. 8 how the image signal generating section 15 performs color information generation processing.

Figure 8:
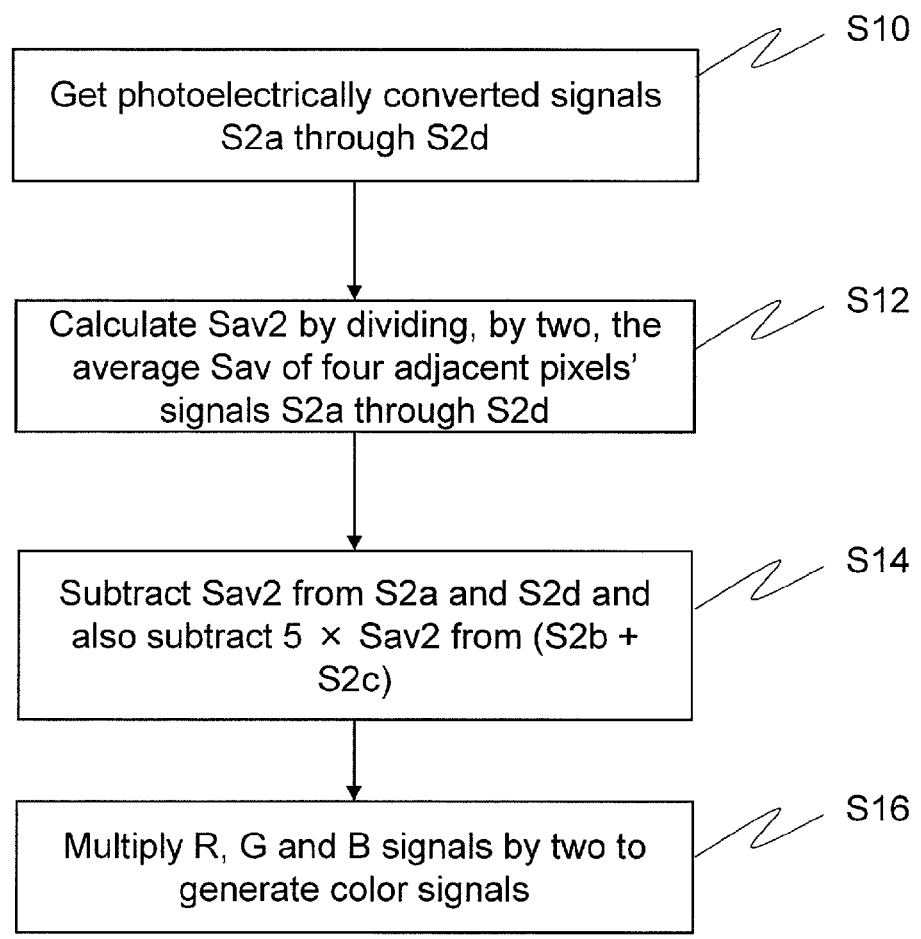
FIG. 8 A flowchart showing the procedure of color information generation processing according to the first embodiment of the present invention.

FIG. 8 is a flowchart showing the procedure of color information generation processing according to this embodiment. First of all, in Step S10, the image signal generating section 15 gets the photoelectrically converted signals S2a through S2d. Next, in Step S12, the image signal generating section 15 calculates the average Sav of S2a through S2d and also calculates Sav2 by dividing Sav by two. Next, in Step S14, the image signal generating section 15 subtracts Sav2 from the pixel signals S2a and S2d to obtain R and B signals, and also subtracts 5×Sav2 from the sum of the pixel signals S2b and S2c to obtain a G signal. Finally, in Step S16, the image signal generating section 15 multiplies the R, G and B signals thus obtained by two to generate RGB color signals as a set of pixel signals.

The image signal generating section 15 performs these signal arithmetic operations on each and every unit block 40 of the photosensitive cell array 2, thereby generating image signals representing RGB color components (which will be referred to herein as "color image signals"). The color image signals thus generated are output by the image signal output section 16 to a storage medium or display section (not shown).

In this manner, the image capture device of this embodiment obtains color image signals by performing addition and subtraction processing on the photoelectrically converted signals S2a through S2d. Since the image sensor 10 of this embodiment uses no optical elements that absorb light, the loss of light can be cut down significantly compared to the existent technology that uses color filters or any other light-absorbing optical elements.

As described above, in the image sensor 10 of this embodiment, a first type of light dispersing elements 1a which split incoming light into a red ray and non-red rays are arranged over the four boundaries between a photosensitive cell at the row 1, column 1 position and the other photosensitive cells so as to face a 2×2 photosensitive cell array. Also, a second type of light dispersing elements 1b which split the incoming light into a blue ray and non-blue rays are arranged over the four boundaries between a photosensitive cell at the row 2, column 2 position and the other photosensitive cells. By using this arrangement as a basic unit, the light dispersing elements 1a and 1b are arranged over each and every one of the photosensitive cells that are arranged two-dimensionally. The light dispersing elements are arranged in that way to form a repetitive pattern over the imaging area. That is why even if a combination of unit blocks 40 to choose from the photosensitive cell array 200 is changed on a row-by-row or column-by-column basis, the four photoelectrically converted signals to be obtained will always be the same combination of four signals that are represented by Equations (16) through (19), respectively. That is to say, by performing the signal arithmetic operations described above with the target pixel blocks shifted either row by row or column by column, information about the RGB color components can be obtained from almost every single one of those pixels. This means that the resolution of the image capture device can be raised to approximately as high as the actual number of pixels. On top of that, by arranging a plurality of light dispersing elements around a single pixel as described above, even though the light ray split by each of those light dispersing elements has a low intensity, a number of those split light rays can be combined together, thus contributing to realizing color representation using even an image sensor with a large pixel cell size. Consequently, the image capture device of this embodiment not only has higher sensitivity, but also can generate a color image with a higher resolution, than conventional image capture devices.

If necessary, the image signal generating section 15 may amplify, synthesize or correct the signals. Ideally, the light-splitting performance of the respective light dispersing elements is exactly as described above. However, their light-splitting performances could be somewhat different from the ideal one. That is to say, the photoelectrically converted signals that are actually output from those photosensitive cells could be different to a certain degree from what is defined by Equations (16) to (19). Even if the light-splitting performances of the respective light dispersing elements are slightly different from the ideal ones, reliable color information can still be obtained by correcting the signals according to the magnitude of the difference.

Optionally, the signal arithmetic operations performed by the image signal generating section 15 of this embodiment may be performed by another device, not the image capture device itself. For example, the color information can also be generated by getting a program defining the signal arithmetic processing of this embodiment executed by an external device that has been provided with the photoelectrically converted signals by the image sensor 10.

Also, even though the ratio k of the split light rays to the overall quantity of incoming light is supposed to be one half in the foregoing description, this is only an example. If the signal processing of this embodiment is expressed with a generalized k, Equations (12) through (15) can be rewritten into the following Equations (20) through (23), respectively, where W's=(1−k)Ws=(1−k)(Rs+Gs+Bs).

$$S2a = W's + kRs \tag{20}$$

$$S2b = W's + kRs/2 + kBs/2 + k(Gs+Bs) + k(Rs+Gs) \tag{21}$$

$$S2c = W's + kRs/2 + kBs/2 + k(Gs+Bs) + k(Rs+Gs) \tag{22}$$

$$S2d = W's + kBs \tag{23}$$

Thus, Rs can be obtained by subtracting W's from S2a and dividing the remainder by k. Bs can be obtained by subtracting W's from S2d and dividing the remainder by k. Gs can be obtained by subtracting 5W's from the sum of S2b and S2c and dividing the remainder by k. W's is obtained by multiplying the average Say of S2a through S2d by k, and Sav is represented by the following Equation (24). That is to say, by performing the arithmetic operations represented by the following Equations (24) through (27), the color signals Rs, Gs and Bs can be obtained.

$$Sav = (S2a + S2b + S2c + S2d)/4 \tag{24}$$

$$Rs = (S2a - kSav)/k \tag{25}$$

$$Gs = ((S2b + S2c) - 5kSav)/k \tag{26}$$

$$Bs = (S2d - kSav)/k \tag{27}$$

It should be noted that the processing described above is just an example. Any other kind of processing may also be carried out as long as color signals can be eventually obtained. For example, color signals may be obtained by performing the following processing. Specifically, Equations (25) and (27) may be rewritten into kRs=S2a−kSa and kBs=S2d−kSav, respectively, where kRs and kBs represent the R and B components of the incoming light. That is why Sav represented by Equation (24) may be used as a luminance signal and (S2a−kSav) and (S2d−kSav) may be used as color difference signals. The image signal generating section 15 may generate these luminance and color difference signals based on the photoelectrically converted signals S2a through S2d and may obtain color signals by converting them into RGB signals.

The basic structure of the image sensor 10 is not limited to the one illustrated in FIGS. 7A through 7F. For example, even if the light dispersing elements 1a and 1b are changed with each other, the effect of this embodiment can also be achieved. Also, in the example described above, the light dispersing elements 1a and 1b are slightly shifted or tilted. However, such an arrangement or structure is adopted solely for the purpose of condensing a particular color ray onto a particular pixel. And it is not always necessary to adopt such a configuration. For example, if a light dispersing element that can split incoming light spatially into RGB rays is available, then such a light dispersing element may be arranged around the pixel at the row 1, column position to condense only an R ray and another light dispersing element like that may be arranged around the pixel at the row 2, column 2 position to condense only a B ray. Then, color representation is realized no less effectively than in the embodiment described above.

In the foregoing description, an optical element that splits incoming light into two by taking-advantage of a difference in refractive index between two members is used as the light dispersing element. However, a light dispersing element according to this embodiment may be anything else as long as it can make a light ray with an intended color component incident on each photosensitive cell. For example, a micro prism or a dichroic mirror may also be used as the light dispersing element. Furthermore, multiple different kinds of light dispersing elements may also be used in combination as well.

Furthermore, in the embodiments described above, incoming light is supposed to be split in both of the x and y directions. However, this is only an example, too.

Alternatively, incoming light may also be split in only one of the x and y directions. Specifically, the light dispersing element array 100 may also be configured so that the incoming light is split either only horizontally as shown in FIGS. 2B, 2C, 3B, 3C, 7B and 7C or only vertically as shown in FIGS. 2D, 2E, 3D, 3E, 7D and 7E. An example of such an alternative configuration is shown in FIGS. 9A through 9C.

Figure 9A:
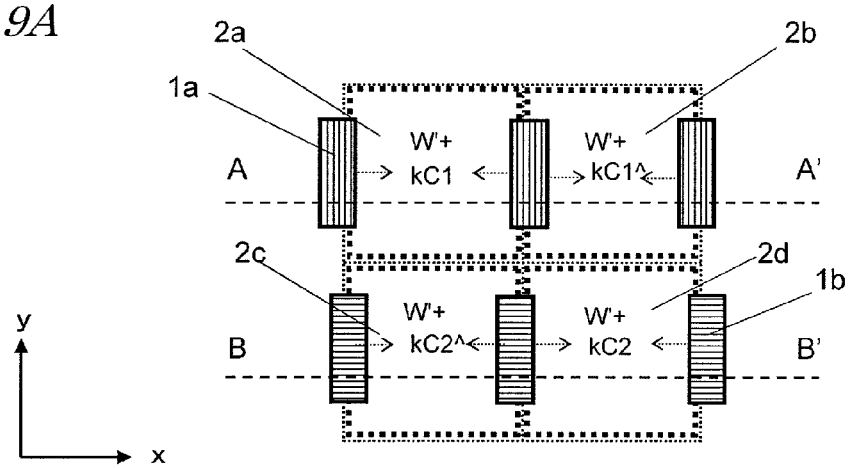
FIG. 9A A plan view illustrating the basic structure of an image sensor as a modified example of the first embodiment.
Figure 9B:
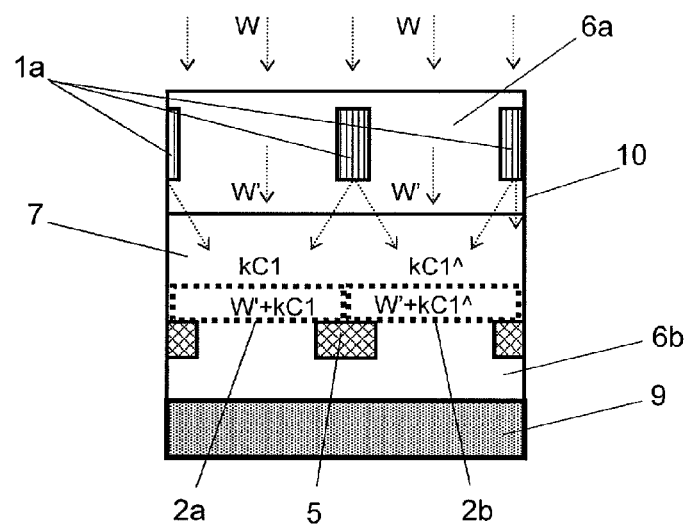
FIG. 9B A cross-sectional view as viewed on the plane A-A' shown in FIG. 9A.
Figure 9C:
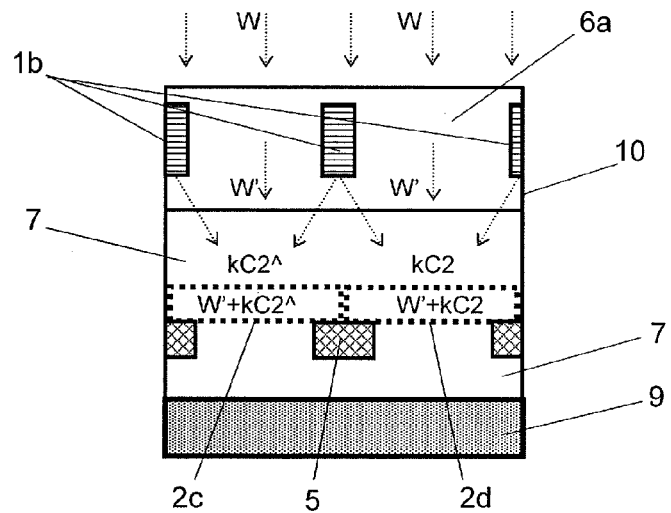
FIG. 9C A cross-sectional view as viewed on the plane B-B' shown in FIG. 9A.
Figure 10:
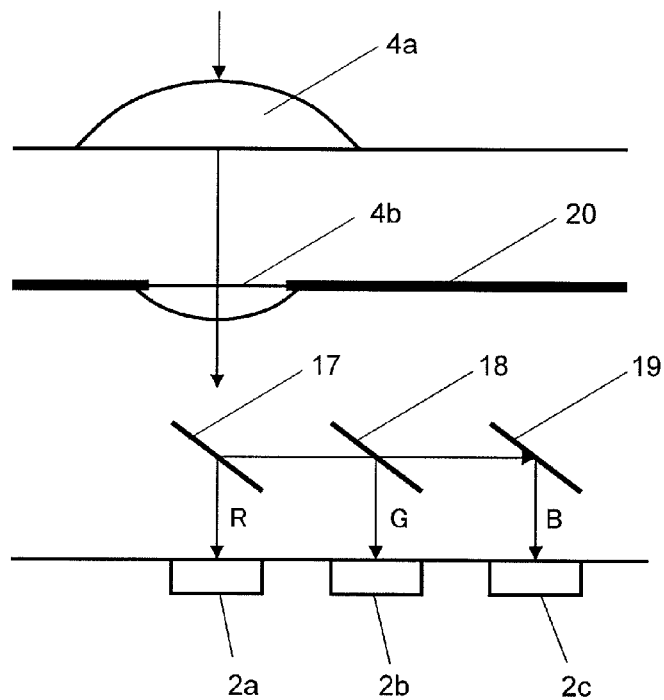
FIG. 10 A cross-sectional view illustrating conventional image sensor that uses micro lenses and multilayer filters (dichroic mirrors).
Figure 11:
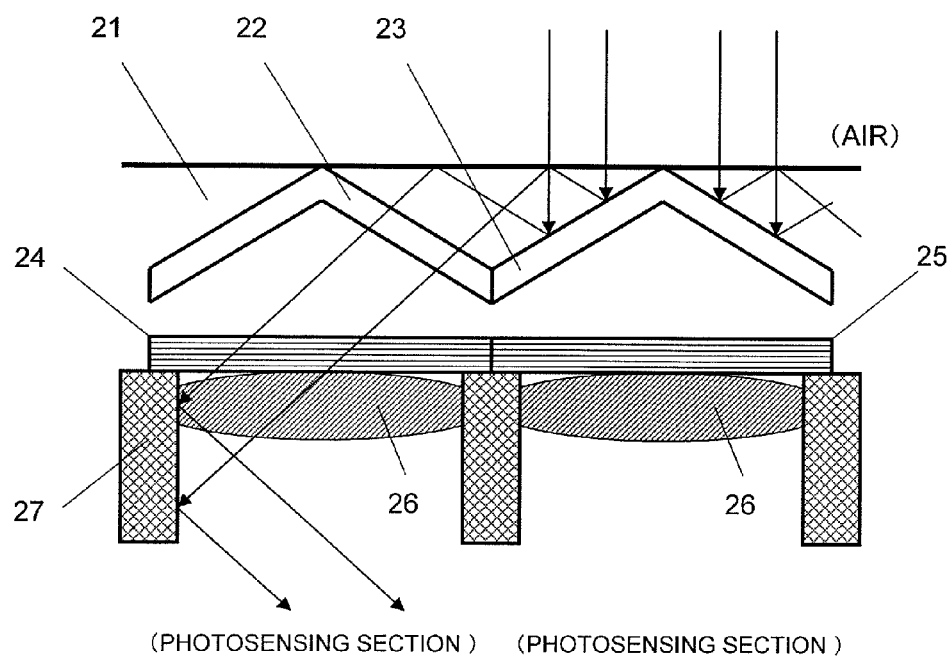
FIG. 11 A cross-sectional view of another conventional image sensor that uses reflection by multilayer filters (dichroic mirrors).

FIG. 9A illustrates an exemplary basic configuration for an image sensor which is configured to split incoming light only horizontally. FIGS. 9B and 9C are cross-sectional views as respectively viewed on the planes A-A' and B-B' shown in FIG. 9A. In this exemplary configuration, a first type of light dispersing element 1a is arranged over the boundary between the first and second photosensitive cells 2a and 2b as shown in FIG. 9A. The light dispersing element 1a is configured to make a part of light rays with a first color component, which is included in the entering light of each of the first and second photosensitive cells 2a and 2b and which has an intensity kC1, incident on the first photosensitive cell 2a and also make its complementary color ray (with an intensity kC1^) incident on the second photosensitive cell 2b. On the other hand, a second type of light dispersing element 1b is arranged over the boundary between the third and fourth photosensitive cells 2c and 2d. The light dispersing element 1b is configured to make a part of light rays with a second color component, which is included in the entering light of each of the third and fourth photosensitive cells 2c and 2d and which has an intensity kC2, incident on the fourth photosensitive cell 2d and also make its complementary color ray (with an intensity kC2^) incident on the third photosensitive cell 2c.

Even if such a simple configuration is adopted, light with the first color component can also be condensed onto the first photosensitive cell 2a, light with the second color component can also be condensed onto the fourth photosensitive cell 2d, and therefore, color signals C1s, C2s and C3s can also be obtained. Specifically, the color signals C1s and C2s can be obtained by multiplying the average Say of the four photosensitive cells' signals by (1−k) to calculate W's and by subtracting W's from the first and second photoelectrically converted signals S2a and Std. Once the color signals C1s and C2s are obtained, the color signal C3s can also be obtained by calculating Sav−C1s−C2s.

INDUSTRIAL APPLICABILITY

A solid-state image sensor, image capture device, method and program according to the present disclosure can be used effectively in every camera that ever uses a solid-state image sensor, and may be used in digital still cameras, digital camcorders and other consumer electronic cameras and in industrial surveillance cameras, to name just a few.

REFERENCE SIGNS LIST 1a, 1b light dispersing element
2, 2a, 2b, 2c, 2d image sensor's photosensitive cell
4a, 4b micro lens
5 image sensor's interconnect layer
6a, 6b transparent layer
7 silicon substrate
9 supporting base
10 image sensor
11 optical filter
12 optical lens
13 signal generating and receiving section
14 sensor driving section
15 image signal generating section
16 image signal output section
17 multilayer filter (dichroic mirror) that reflects every ray but red (R) ray
18 multilayer filter (dichroic mirror) that reflects only green (G) ray
19 multilayer filter (dichroic mirror) that reflects only blue (B) ray
20 opaque portion
21 light-transmitting resin
22 multilayer filter (dichroic mirror) that transmits G ray
23 multilayer filter (dichroic mirror) that transmits R ray
24 organic dye filter that transmits G ray
25 organic dye filter that transmits R ray
26 micro lens
27 metal layer
30 memory
40 unit block of photosensitive cells
100 light dispersing element array
200 photosensitive cell array
300 image capturing section
400 signal processing section

The invention claimed is:

1. A solid-state image sensor comprising:
a photosensitive cell array in which a plurality of unit blocks are arranged two-dimensionally, each said unit block including first, second, third and fourth photosensitive cells; and
a light dispersing element array that is arranged so as to face the photosensitive cell array and that includes first and second types of light dispersing elements, wherein if light that would be directly incident on each said photosensitive cell, were it not for the light dispersing element array, is called that photosensitive cell's entering light and if visible light rays included in the cell's entering light is comprised of first, second and third color components and if a rest of the visible light rays, which is made up of color components other than a particular one of the first, second and third color components, is called a complementary color ray of that particular color component, the light dispersing element array is configured so that the first type of light dispersing element makes a part of light rays with the first color component, which is included in the entering light of each of the first and second photosensitive cells, incident on the first photosensitive cell and that the second type of light dispersing element makes a part of light rays with the second color component, which is included in the entering light of each of the third and fourth photosensitive cells, incident on the fourth photosensitive cell, wherein each of the first through fourth photosensitive cells has a square shape, wherein the first through fourth photosensitive cells are arranged in two rows and two columns, wherein the first type of light dispersing element is arranged to face a boundary between the first and second photosensitive cells, and wherein the second type of light dispersing element is arranged to face a boundary between the third and fourth photosensitive cells.

2. The solid-state image sensor of claim 1, wherein the first type of light dispersing element is arranged to face a boundary between the first and third photosensitive cells, too, and wherein the second type of light dispersing element is arranged to face a boundary between the second and fourth photosensitive cells, too.

3. A solid-state image sensor comprising:

a photosensitive cell array in which a plurality of unit blocks are arranged two-dimensionally, each said unit block including first, second, third and fourth photosensitive cells; and a light dispersing element array that is arranged so as to face the photosensitive cell array and that includes first and second types of light dispersing elements, wherein if light that would be directly incident on each said photosensitive cell, were it not for the light dispersing element array, is called that photosensitive cell's entering light and if visible light rays included in the cell's entering light is comprised of first, second and third color components and if a rest of the visible light rays, which is made up of color components other than a particular one of the first, second and third color components, is called a complementary color ray of that particular color component, the light dispersing element array is configured so that the first type of light dispersing element makes a part of light rays with the first color component, which is included in the entering light of each of the first and second photosensitive cells, incident on the first photosensitive cell and that the second type of light dispersing element makes a part of light rays with the second color component, which is included in the entering light of each of the third and fourth photosensitive cells, incident on the fourth photosensitive cell, wherein the first type of light dispersing element further makes a part of light rays with the first color component, which is included in the entering light of each of the first and third photosensitive cells, incident on the first photosensitive cell, and wherein the second type of light dispersing element further makes a part of light rays with the second color component, which is included in the entering light of each of the second and fourth photosensitive cells, incident on the fourth photosensitive cell.

4. The solid-state image sensor of claim 3, wherein the first type of light dispersing element makes a part of the light ray with the first color component, which is included in the entering light of each of the first and second photosensitive cells, incident on the first photosensitive cell, and also makes the rest of the light ray with the first color component and a complementary color ray of the first color component incident on the second photosensitive cell, and wherein the second type of light dispersing element makes a part of the light ray with the second color component, which is included in the entering light of each of the third and fourth photosensitive cells, incident on the fourth photosensitive cell, and also makes the rest of the light ray with the second color component and a complementary color ray of the second color component incident on the third photosensitive cell.

5. The solid-state image sensor of claim 3, wherein the first type of light dispersing element further makes a part of the light ray with the first color component, which is included in the entering light of each of the first and third photosensitive cells, incident on the first photosensitive cell, and also makes the rest of the light ray with the first color component and a complementary color ray of the first color component incident on the third photosensitive cell, and wherein the second type of light dispersing element makes a part of the light ray with the second color component, which is included in the entering light of each of the second and fourth photosensitive cells, incident on the fourth photosensitive cell, and also makes the rest of the light ray with the second color component and a complementary color ray of the second color component incident on the second photosensitive cell.

6. A solid-state image sensor comprising:

a photosensitive cell array in which a plurality of unit blocks are arranged two-dimensionally, each said unit block including first, second, third and fourth photosensitive cells; and a light dispersing element array that is arranged so as to face the photosensitive cell array and that includes first and second types of light dispersing elements, wherein if light that would be directly incident on each said photosensitive cell, were it not for the light dispersing element array, is called that photosensitive cell's entering light and if visible light rays included in the cell's entering light is comprised of first, second and third color components and if a rest of the visible light rays, which is made up of color components other than a particular one of the first, second and third color components, is called a complementary color ray of that particular color component, the light dispersing element array is configured so that the first type of light dispersing element makes a part of light rays with the first color component, which is included in the entering light of each of the first and second photosensitive cells, incident on the first photosensitive cell and that the second type of light dispersing element makes a part of light rays with the second color component, which is included in the entering light of each of the third and fourth photosensitive cells, incident on the fourth photosensitive cell wherein the first type of light dispersing element includes four light dispersing elements that are arranged to face four boundaries that surround the first photosensitive cell, and wherein the second type of light dispersing element includes four light dispersing elements that are arranged to face four boundaries that surround the fourth photosensitive cell.

7. The solid-state image sensor of claim 6, wherein the first color component is one of colors red and blue components and the second color component is the other of the colors red and blue components.

8. The solid-state image sensor of claim 6, wherein each of the first and second types of light dispersing elements has a light-transmitting member, and splits the incoming light by using the shape of the light-transmitting member and a difference in refractive index between that light-transmitting member and another light-transmitting member that has a lower refractive index than the former light-transmitting member.

9. An image capture device comprising:
the solid-state image sensor of claim 1;
an optical system that produces an image on the solid-state image sensor; and
a signal processing section that processes signals supplied from the solid-state image sensor and that generates color information by performing arithmetic operations on first, second, third and fourth photoelectrically converted signals that have been supplied from the first, second, third and fourth photosensitive cells, respectively.

10. The image capture device of claim 9, wherein the signal processing section generates first and second color difference signals by calculating the difference between the first photoelectrically converted signal and the average of the first through fourth photoelectrically converted signals and the difference between the fourth photoelectrically converted signal and the first through fourth photoelectrically converted signals.

11. A method for processing output signals of the solid-state image sensor of claim 1, the method comprising the steps of:
(A) getting first, second, third and fourth photoelectrically converted signals from the first, second, third and fourth photosensitive cells, respectively; and
(B) generating color information based on the first through fourth photoelectrically converted signals.

12. The signal processing method of claim 11, wherein the step (B) includes the steps of:
generating a first differential signal by calculating the difference between the first and second photoelectrically converted signals; and
generating a second differential signal by calculating the difference between the third and fourth photoelectrically converted signals.

13. The signal processing method of claim 12, wherein the step (B) includes the steps of:
generating a luminance signal by performing an arithmetic operation that involves adding together the first and second photoelectrically converted signals, or the third and fourth photoelectrically converted signals, or the first through fourth photoelectrically converted signals; and
generating colors red, green and blue signals included in the cell's entering light based on the luminance signal and the first and second differential signals.

\* \* \* \* \*